(12) United States Patent
Oshima et al.

(10) Patent No.: US 9,961,767 B2
(45) Date of Patent: May 1, 2018

(54) CIRCUIT BOARD AND METHOD OF MANUFACTURING CIRCUIT BOARD

(71) Applicant: SHINKO ELECTRIC INDUSTRIES CO., LTD., Nagano (JP)

(72) Inventors: Kazuhiro Oshima, Nagano (JP); Hiroharu Yanagisawa, Nagano (JP); Kazuhiro Kobayashi, Nagano (JP); Katsuya Fukase, Nagano (JP); Ken Miyairi, Nagano (JP)

(73) Assignee: SHINKO ELECTRIC INDUSTIRES CO., LTD., Nagano (JP)

( * ) Notice: Subject to any disclaimer, the term of this patent is extended or adjusted under 35 U.S.C. 154(b) by 83 days.

(21) Appl. No.: 14/990,978

(22) Filed: Jan. 8, 2016

(65) Prior Publication Data

US 2016/0234932 A1  Aug. 11, 2016

(30) Foreign Application Priority Data

Feb. 10, 2015 (JP) ................................. 2015-024770
May 18, 2015 (JP) ................................. 2015-101245

(51) Int. Cl.

| | |
|---|---|
| *H05K 1/18* | (2006.01) |
| *H05K 1/03* | (2006.01) |
| *H05K 3/00* | (2006.01) |
| *H05K 3/46* | (2006.01) |
| *H05K 7/12* | (2006.01) |
| *H05K 7/00* | (2006.01) |

(Continued)

(52) U.S. Cl.

CPC ............. *H05K 1/036* (2013.01); *H05K 3/007* (2013.01); *H05K 3/4682* (2013.01); *H05K 1/02* (2013.01); *H05K 1/0296* (2013.01); *H05K 1/0298* (2013.01); *H05K 1/0366* (2013.01); *H05K 1/111* (2013.01); *H05K 1/181* (2013.01); *H05K 3/3436* (2013.01); *H05K 2201/01* (2013.01); *H05K 2201/0183* (2013.01); *H05K 2201/10* (2013.01)

(58) Field of Classification Search
CPC ...... H05K 1/02; H05K 1/0296; H05K 1/0298; H05K 2201/20; H05K 1/038; H05K 1/0313; H05K 2201/01; H05K 2201/0183; H05K 2201/09236; H05K 2201/10; H05K 1/111
USPC ........ 361/748, 750, 760, 761, 762, 767, 771
See application file for complete search history.

(56) References Cited

U.S. PATENT DOCUMENTS

| 7,397,000 B2 | 7/2008 | Shimoto et al. |
|---|---|---|
| 8,179,689 B2 * | 5/2012 | Mashino ............. H01L 21/6835 361/760 |

(Continued)

FOREIGN PATENT DOCUMENTS

| JP | 2005-327780 | 11/2005 |
|---|---|---|
| WO | 2007/126090 | 11/2007 |

*Primary Examiner* — Binh Tran
(74) *Attorney, Agent, or Firm* — IPUSA, PLLC

(57) ABSTRACT

A circuit board includes an insulating layer including first and second insulator films, a first wiring layer embedded in the first insulator film and including pads and first wiring patterns exposed from the first insulator film, and a second wiring layer including second wiring patterns formed on the second insulator film and via wirings penetrating the insulating layer and electrically connecting the second wiring patterns to the first wiring layer. The first insulator film is made of a reinforcement-free resin that includes no reinforcing member. The second insulator film is made of a reinforcing member impregnated with a resin.

18 Claims, 15 Drawing Sheets

(51) Int. Cl.
  *H05K 1/02*   (2006.01)
  *H05K 1/11*   (2006.01)
  *H05K 3/34*   (2006.01)

(56) References Cited

U.S. PATENT DOCUMENTS

| | | |
|---|---|---|
| 2010/0044845 A1 | 2/2010 | Funaya et al. |
| 2011/0316148 A1* | 12/2011 | Kondo ................ H01L 21/4857 257/737 |
| 2014/0021625 A1* | 1/2014 | Nakamura ............ H01L 23/145 257/773 |
| 2016/0150651 A1* | 5/2016 | Tsai ........................ H05K 1/186 174/251 |

\* cited by examiner

CIRCUIT BOARD AND METHOD OF MANUFACTURING CIRCUIT BOARD

CROSS-REFERENCE TO RELATED APPLICATIONS

This application is based upon and claims the benefit of priorities of the prior Japanese Patent Applications No. 2015-024770, filed on Feb. 10, 2015, and No. 2015-101245, filed on May 18, 2015, the entire contents of which are incorporated herein by reference.

FIELD

The embodiments discussed herein are related to a circuit board, and a method of manufacturing the circuit board.

BACKGROUND

Conventionally, the so-called build-up circuit board is known. The build-up circuit board includes wiring layers and insulating layers that are alternately stacked, and via holes penetrating at least one insulating layer and electrically connecting at least two wiring layers. In the build-up circuit board having such a structure, the strength of the circuit board may be insufficient in a case in which the insulating layers do not include a reinforcing member. For this reason, the so-called prepreg having a reinforcing member impregnated with an insulating resin may be used as the outermost insulating layer, to strengthen the circuit board. For example, Japanese Laid-Open Patent Publication No. 2005-327780 (now Japanese Patent No. 4108643) proposes a circuit board having the prepreg insulating layer.

However, in a case in which the prepreg insulating layer is used and the outermost insulating layer is made thin, glass cloth or the like of the reinforcing member may make contact with the wiring layer embedded in the outermost insulating layer, to deteriorate the insulating reliability.

In addition, the prepreg has a high melting viscosity and the embeddability of the resin may be insufficient. For this reason, in a case in which the wiring layer embedded in the outermost insulating layer is a fine or micro wiring layer, the resin filling gaps in the wiring layer may be insufficient and generate voids or the like, to deteriorate the insulating reliability.

SUMMARY

Accordingly, it is an object in one aspect of the embodiments to provide a circuit board and a method of manufacturing the circuit board, which can improve the strength and the insulating reliability of the circuit board.

According to one aspect of the embodiments, a circuit board includes an insulating layer including a first insulator film, and a second insulator film provided on one surface of the first insulator film, wherein another surface of the first insulator film is exposed to an outside of the circuit board; a first wiring layer, embedded in the first insulator film, and including a predetermined surface provided with a plurality of pads and a plurality of first wiring patterns, wherein a surface of each of the plurality of pads, forming the predetermined surface, is exposed from the other surface of the first insulator film; and a second wiring layer including a plurality of second wiring patterns formed on one surface of the second insulator film opposite to another surface of the second insulator film in contact with the one surface of the first insulator film, and a plurality of via wirings penetrating the insulating layer and electrically connecting the second wiring patterns to the first wiring layer, wherein the first insulator film is made of a reinforcement-free resin including no reinforcing member, and wherein the second insulator film is made of a reinforcing member impregnated with a resin.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
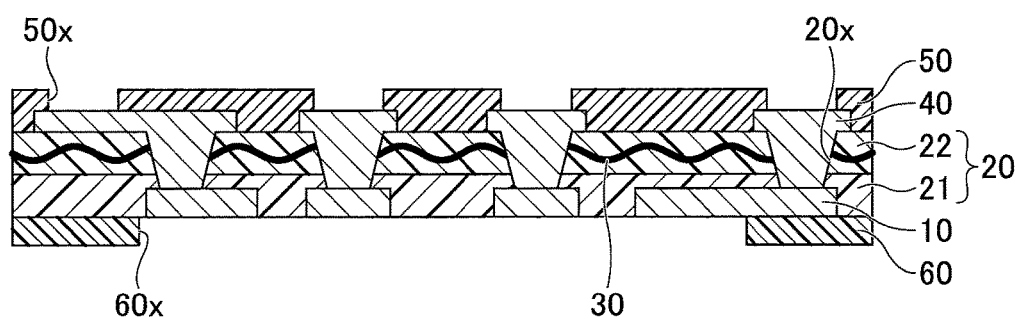
FIGS. 1A and 1B are diagrams illustrating an example of a circuit board in a first embodiment.

Preferred embodiments of the present invention will be described with reference to the accompanying drawings. In the drawings, those parts that are the same are designated by the same reference numerals, and a description of the same parts will be omitted.

A description will now be given of a circuit board and a method of manufacturing the circuit board, in each embodiment according to the present invention.

(First Embodiment)

[Structure of Circuit Board in First Embodiment]

Figure 1B:
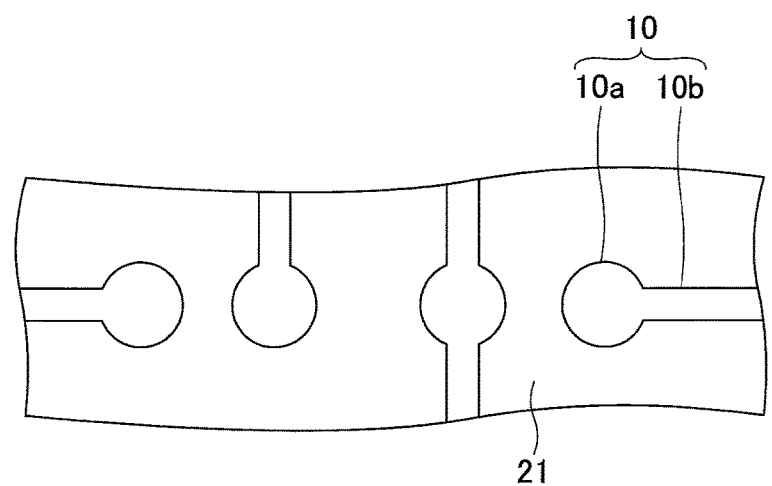

First, a description will be given of a structure of a circuit board in a first embodiment. FIGS. 1A and 1B are diagrams illustrating an example of the circuit board in the first embodiment. FIG. 1A is a cross sectional view of the circuit board, and FIG. 13 is a bottom view of the circuit board.

A circuit board 1 in the first embodiment illustrated in FIGS. 1A and 1B is an example of a coreless build-up circuit board having a wiring layer 10, an insulating layer 20, a wiring layer 40, and solder resist layers 50 and 60.

In this embodiment, it is assumed for the sake of convenience that the side of the solder resist layer 50 is an upper side or one side of the circuit board 1, and that the side of the solder resist layer 60 is a lower side or the other side of the circuit board 1. In addition, in each part of the circuit board 1, the side closer to the solder resist layer 50 is referred to as one surface or an upper surface, and the side closer to the solder resist layer 60 is referred to as the other surface or a lower surface. Of course, the circuit board 1 may be used in a state that is upside-down, or in a state that is inclined at an arbitrary angle, with respect to a state illustrated in FIG. 1A. Further, a plan view of a target refers to a view of the target viewed from a normal direction to the one surface of the solder resist layer 50, and a planar shape of the target refers to a shape of the target viewed from the normal direction to the one surface of the solder resist layer 50.

In the circuit board 1, the wiring layer 10 is an example of a first wiring layer, and includes a plurality of pads 10a, and wiring patterns 10b connected to the pads 10a. The pads 10a form connecting terminals for making electrical connection to a semiconductor chip. Parts exposed through an opening 60x of the solder resist layer 60 are mainly the pads 10a, and parts covered by the solder resist layer 60 are mainly the wiring patterns 10b. However, a part of the wiring patterns 10b may be exposed through the opening 60x of the solder resist layer 60. For example, the wiring layer 10 may be made of copper (Cu) or the like. The wiring layer 10 may have a thickness in a range of 1 μm to 35 μm, for example.

The insulating layer 20 includes a first insulator film 21, and a second insulator film 22 stacked on the top surface (one surface) of the first insulator film 21. The insulator film 21 forms an outermost insulating layer, and a part of a lower surface (other surface) of the first insulator film 21 is exposed to an outside of the circuit board 1. In this embodiment, the lower surface of the first insulator film 21 forms an example of a chip mounting surface on which the semiconductor chip is mounted. In this specification, "a reinforcement-free insulating resin" refers to an insulating resin that includes no reinforcing member, but may additionally include an additive such as a filler or the like.

The first insulator film 21 covers the wiring layer 10. More particularly, the first insulator film 21 covers side surfaces and an upper surface of the wiring layer 10. In other words, the wiring layer 10 is embedded in the first insulator film 21, and a lower surface of the wiring layer 10, forming an example of a predetermined surface, is exposed at the lower surface of the first insulator film 21. The lower surface of the first insulator film 21 and the lower surface of the wiring layer 10 may match and form a single surface, for example. A surface of each of the plurality of pads 10a, forming the predetermined surface, is exposed from the lower surface of the first insulator film 21.

For example, the first insulator film 21 may be made of an insulating resin such as epoxy resins, imide resins, phenol resins, cyanate resins, or the like. For example, the insulating resin used for the first insulator film 21 may be a thermosetting resin. The first insulator film 21 may have a thickness in a range of 1 μm to 100 μm, for example. The first insulator film 21 may include a filler such as silica ($SiO_2$) or the like.

The second insulator film 22 has a structure in which a reinforcing member 30 is impregnated with an insulating resin. In this specification, an insulator film having "a structure in which a reinforcing member is impregnated with an insulating resin" refers to a structure in which the insulator film includes at least the reinforcing member and the insulating resin, but may additionally include an additive such as a filler or the like.

For example, the reinforcing member 30 may be made of a woven cloth of glass fiber, carbon fiber, aramid fiber, or the like, a nonwoven cloth, or the like. For example, the second insulator film 22 may be made of an insulating resin such as epoxy resins, imide resins, phenol resins, cyanate resins, or the like. For example, the insulating resin used for the second insulator film 22 may be a thermosetting resin. The second insulator film 22 may have a thickness in a range of 15 μm to 200 μm, for example. The second insulator film 22 may include a filler such as silica ($SiO_2$) or the like.

The kind of insulating resin used and the thickness of the first insulator film 21 may be determined independently of the kind of insulating resin used and the thickness of the second insulator film 22. In other words, the first insulator film 21 and the second insulator film 22 may be made of the same insulating resin, or may be made of mutually different insulating resins. In addition, the first insulator film 21 and the second insulator film 22 may have the same thickness, or may have mutually different thicknesses. In addition, one of the first and second insulator films 21 and 22 may include a filler, or both the first and second insulator films 21 and 22 may include the filler. In a case in which both the first and second insulator films 21 and 22 include the filler, the kind of filler used and the amount of filler used (or filler content) may be the same, or may be mutually different, between the first and second insulator films 21 and 22. The kind of insulating resin used, the thickness of the insulating resin, the kind of filler used, the amount of filler used, or the like may be adjusted for each of the first and second insulator films 21 and 22, to control a CTE (Coefficient of Thermal Expansion) to 15 ppm/° C. or less, and suppress warping of the circuit board 1.

The wiring layer 40 is an example of a second wiring layer, and is formed on the insulating layer 20. The wiring layer 40 includes via wirings and wiring patterns. The via wirings fill via holes 20x that penetrate the insulating layer 20 (the second insulator film 22 and the first insulator film 21) and expose the upper surface of the wiring layer 10. The wiring patterns are formed on an upper surface of the second insulator film 22. An opening of the via hole 20x on the side of the solder resist layer 50 has a larger diameter than an opening of the via hole 20x at the upper surface of the wiring layer 10, and the via hole 20x forms a recess having an inverted cone shape.

The wiring layer 40 is electrically connected to the wiring layer 10 that is exposed at a bottom part of the via hole 20x. For example, the wiring layer 40 may be made of copper (Cu) or the like. The wiring patterns of the wiring layer 40 may have a thickness in a range of 1 µm to 35 µm, for example.

The solder resist layer 50 is formed on the upper surface of the second insulator film 22, to cover the wiring layer 40. The solder resist layer 50 has an opening 50x, and a part of the wiring layer 40 is exposed at a bottom part of the opening 50x. The wiring layer 40 exposed at the bottom part of the opening 50x may function as a pad that electrically connects to another circuit board, a semiconductor package, a semiconductor chip, or the like. For example, the solder resist layer 50 may be made of a photosensitive epoxy insulating resin, a photosensitive acrylic insulating resin, or the like. The solder resist layer 50 may have a thickness in a range of 5 µm to 40 µm, for example.

A metal layer may be formed on the upper surface of the wiring layer 40 that is exposed at the opening 50x, if necessary. Examples of the metal layer include a Au layer, a Ni/Au layer (metal multilayer made up of a Ni layer and a Au layer that are stacked), a Ni/Pd/Au layer (metal multilayer made up of a Ni layer, a Pd layer, and a Au layer that are stacked in this order), or the like. Instead of forming the metal layer, it is possible to perform an oxidation preventing process, such as an OSP (Organic Solderability Preservative) process or the like. A surface-treated layer that is formed by the OSP process may be an organic film made of an azole compound, an imidazole compound, or the like.

The solder resist layer 60 is formed on the lower surface of the first insulator film 21, to cover the wiring layer 10. The solder resist layer 60 has an opening 60x, and mainly the pad 10a of the wiring layer 10 is exposed at a bottom part of the opening 60x. For example, the solder resist layer 60 may be made of a photosensitive epoxy insulating resin, a photosensitive acrylic insulating resin, or the like. The solder resist layer 60 may have a thickness in a range of 5 µm to 40 µm, for example. A metal layer described above may be formed on the lower surface of the wiring layer 10 that is exposed at the opening 60x, or the oxidation preventing process described above may be performed instead of forming the metal layer, if necessary.

The pads 10a of the wiring layer 10 are adjacent to each other at intervals in a range of several µm to ten-odd µm, for example. For this reason, it is difficult to provide a plurality of openings to separately expose the lower surface of each pad 10a. Hence, this embodiment provides one opening 60x in the solder resist layer 60 to simultaneously expose the lower surface of each of the pads 10a of the wiring layer 10. Of course, a plurality of openings that separately expose the lower surface of each of the pads lea may be provided in the solder resist layer 60, in a case in which the pads 10a are not provided at short intervals, that is, not provided with a narrow pitch.

[Method of Manufacturing Circuit Board in First Embodiment]

Next, a description will be given of a method of manufacturing the circuit board in the first embodiment. FIGS. 2A, 2B, 2C, and 2D and FIGS. 3A, 3B, and 3C are diagrams illustrating an example of manufacturing processes of the circuit board in the first embodiment. In this embodiment, parts that become a plurality of circuit boards are made on a support base, and the support base is removed before separating the parts to form the plurality of circuit boards. However, it is possible to make the circuit board, one by one on the support base, and remove the support base to obtain each circuit board.

Figure 2A:
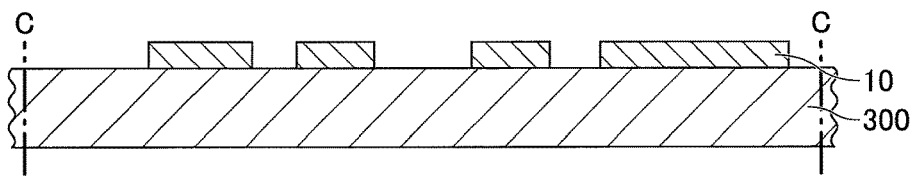
FIGS. 2A, 2B, 2C, and 2D are diagrams illustrating an example of manufacturing processes of the circuit board in the first embodiment.

First, in a process illustrated in FIG. 2A, a support base 300 having a flat (or planar) upper surface is prepared, and the wiring layer 10 is formed on the upper surface of the support base 300. For example, the support base 300 may be made of a metal plate, a metal film, or the like. In this embodiment, the support base 300 is made of a copper film. The support base 300 may have a thickness in a range of 18 µm to 100 µm, for example.

When forming the wiring layer 10, a resist layer made of a dry film resist, or the like, for example, and having openings at parts where the wiring layer 10 is to be formed, is first formed on the upper surface of the support base 300. The wiring layer 10 is formed on the upper surface of the support base 300 exposed within the openings in the resist layer, by electroplating or the like, that uses the support base 300 as a plating feed layer. The resist layer is removed thereafter. The material and the thickness of the wiring layer 10 may be the same as those described above.

Figure 2B:
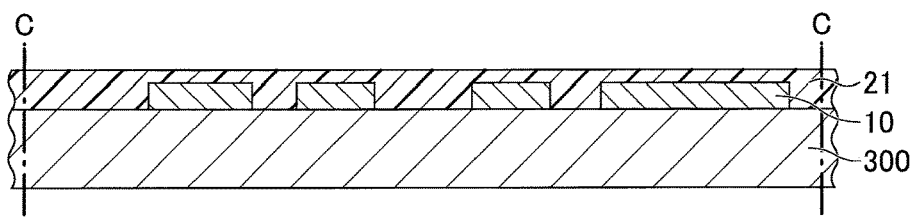

Next, in a process illustrated in FIG. 2B, a thermosetting epoxy insulating resin or the like, for example, is laminated on the upper surface of the support base 300, to cover the upper surface and the side surfaces of the wiring layer 10, and form the first insulator film 21 in a B-stage (or semi-cured state). The first insulator film 21 is made of a reinforcement-free insulating layer. In this process, the first insulator film 21 is not cured, or not completely cured.

In the process of forming the wiring layer 10, a photosensitive permanent insulator film may be used in place of the resist layer made of the dry film resist or the like. In this case, after forming the wiring layer 10 in the openings of the permanent insulator film, this permanent insulator film does not need to be removed, and this permanent insulator film may be used as the first insulator film 21.

Figure 2C:
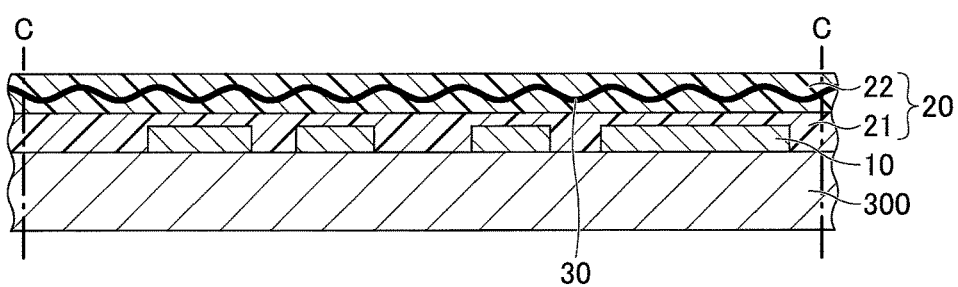

Next, in a process illustrated in FIG. 2C, a thermosetting epoxy insulating resin or the like, for example, is laminated on the upper surface of the first insulator film 21, to stack the second insulator film 22 in a B-stage (or semi-cured state). The second insulator film 22 is the so-called prepreg having the structure in which the reinforcing member 30 is impregnated with the insulating resin. The material of the reinforcing member 30 may be the same as that described above. After stacking the second insulator film 22 on the upper surface of the first insulator film 21, the first insulator film 21 and the second insulator film 22 are heated to a predetermined temperature and cured, to form the insulating layer 20. The first and second insulator films 21 and 22 may be heated while applying pressure, if necessary.

Compared to the melting viscosity of the reinforcement-free insulating resin forming the first insulator film 21, the melting viscosity of second insulator film 22 formed by the reinforcing member 30 impregnated with the insulating resin is higher. In this embodiment, because the wiring layer 10 is covered by the first insulator film 21 having the relatively low melting viscosity, the melted insulating resin can fill gaps in the wiring layer 10 even in a case in which a wiring density of the wiring layer 10 is high, or a remaining copper rate of the wiring layer 10 is high. For this reason, compared to a case in which the wiring layer 10 is covered by an insulating layer containing a reinforcing member having a relatively high melting viscosity, voids caused by insufficient filling by the insulating resin are unlikely to be generated in this embodiment. The remaining copper rate refers to a ratio of an area of the wiring layer (copper) occupying the surface of the insulating layer to an area of the insulating layer surface.

Generally, when a wiring layer makes contact with a reinforcing member, migration may be generated along the reinforcing member. For example, in a case in which glass cloth is used for the reinforcing member, the migration may be generated along fibers of the glass cloth, and adjacent wiring patterns may be short-circuited. However, in the case of the circuit board 1, the wiring layer 10 will not make contact with a reinforcing member (including the reinforcing member 30). As a result, the generation of the migration can be suppressed in the circuit board 1, and the insulating reliability of the circuit board 1 can be improved.

More particularly, in the circuit board 1, the outermost wiring layer 10 not only includes the pads 10a but also includes the wiring patterns 10b. For this reason, although the remaining copper rate may greatly differ depending on the location, the gaps in the wiring layer 10 can be filled sufficiently by the first insulator film 21 having the relatively low melting viscosity.

Figure 2D:
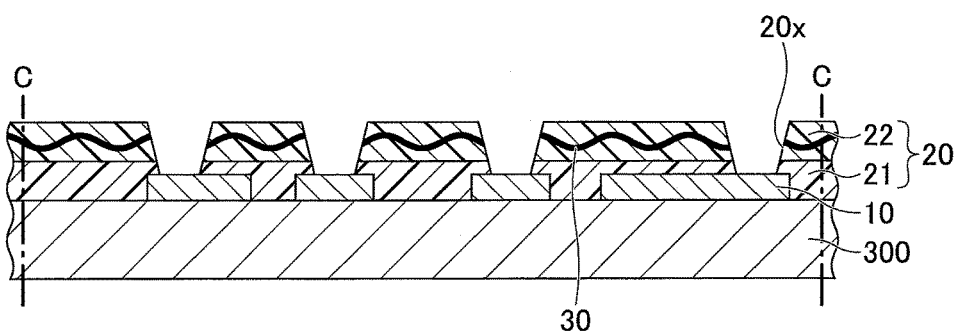

Next, in a process illustrated in FIG. 2D, via holes 20x are formed in the insulating layer 20. The via holes 20x penetrate the second insulator film 22 and the first insulator film 21 of the insulating layer 20, and expose the upper surface of the wiring layer 10. The via holes 20x may be formed by laser beam machining using $CO_2$ laser or the like, for example. The opening of the via hole 20x on the side of the solder resist layer 50, formed by the laser beam machining, has the larger diameter than the opening of the via hole 20x at the upper surface of the wiring layer 10, and the via hole 20x forms the recess having the inverted cone shape. In the case in which the via holes 20x are formed by the laser beam machining, a desmear process is preferably performed to remove residual resin of the insulating layer 20, adhered to the upper surface of the wiring layer 10 exposed at the bottom part of the via holes 20x.

The first insulator film 21 and the second insulator film 22 may use mutually different resins, or have mutually different filler contents (that is, amounts of filler). In this case, a laser irradiation condition or the like may be changed between a stage in which the laser is irradiated on the second insulator film 22 and a stage in which the laser is irradiated on the first insulator film 21 by penetrating the second insulator film 22. The change in the laser irradiation condition or the like can prevent a stepped part or the like to be generated on an inner wall surface defining the via hole 20x, at a boundary part between the first insulator film 21 and the second insulator film 22. Alternatively, the conditions of the desmear process may be adjusted, to control a shape of the inner wall surface defining the via holes 20x.

Figure 3A:
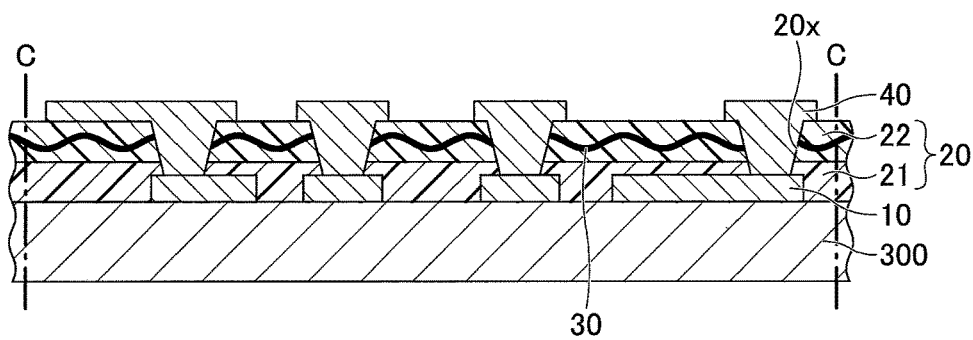
FIGS. 3A, 3B, and 3C are diagrams illustrating an example of the manufacturing processes of the circuit board in the first embodiment.

Next, in a process illustrated in FIG. 3A, the wiring layer 40 is formed on the insulating layer 20. The wiring layer 40 includes via wirings filling the via holes 20x, and wiring patterns formed on the upper surface of the insulating layer 20. The wiring layer 40 is electrically connected to the wiring layer 10 exposed at the bottom part of the via holes 20x. The wiring layer 40 may be made of copper (Cu) or the like, for example. The wiring layer 40 may be formed by various kinds of wiring layer forming methods, such as a semi-additive method, a subtractive method, or the like.

Figure 3B:
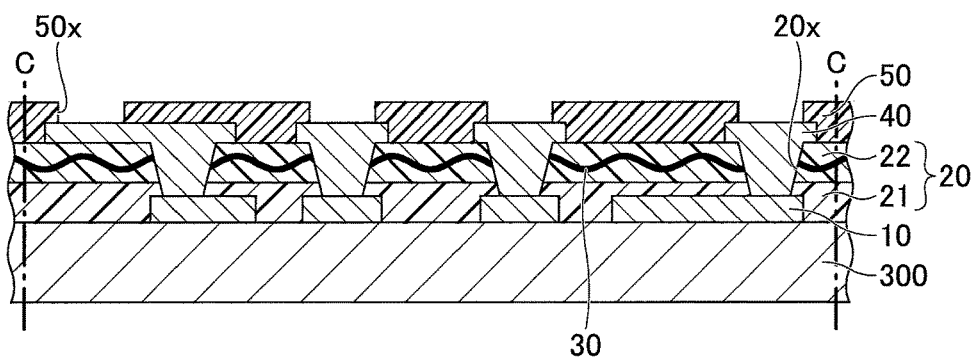

Next, in a process illustrated in FIG. 3B, the solder resist layer 50 covering the wiring layer 40 is formed on the insulating layer 20. The solder resist layer 50 may be formed by coating the photosensitive epoxy insulating resin, the photosensitive acrylic insulating resin, or the like in liquid form or paste form, for example, on the insulating layer 20 to cover by the wiring layer 40, using screen printing, roll coating, spin-coating, or the like. Alternatively, the solder resist layer 50 may be formed by laminating the photosensitive epoxy insulating resin, the photosensitive acrylic insulating resin, or the like in film form, for example, on the insulating layer 20 to cover the wiring layer 40.

The coated or laminated insulating resin is exposed and developed to form the opening 50x by lithography technique. Accordingly, the solder resist layer 50 having the opening 50x is formed. Of course, an insulating resin film preformed with the opening 50x may be laminated on the insulating layer 20 to cover the wiring layer 40. A non-photosensitive resin may be used for the solder resist layer 50. In this case, after the solder resist layer 50 is formed on the insulating layer 20 and cured, the opening 50x may be formed by the laser beam machining using $CO_2$ laser, blast process using an abrasive such as alumina abrasive grains or the like, for example. Alternatively, the solder resist layer 50 having the opening 50x may be formed by screen printing.

Accordingly, a part of the wiring layer 40 is exposed within the opening 50x. The wiring layer 40 that is exposed within the opening 50x may function as the pad that electrically connects to another circuit board, a semiconductor package, a semiconductor chip, or the like. A metal layer may be formed by electroless plating or the like, for example, on the upper surface of the wiring layer 40 that is exposed at the bottom part of the opening 50x, if necessary. The metal and the layer structure of the metal layer may be the same as those described above. In addition, the oxidation preventing process such as the OSP process or the like may be performed on the upper surface of the wiring layer 40 that is exposed at the bottom part of the opening 50x. The process of forming the solder resist layer 50 may be performed after removing the support base 300. In this case, the solder resist layer 50 and the solder resist layer 60 may be formed simultaneously.

Next, in a process illustrated in FIG. 3O, after removing the support base 300 illustrated in FIG. 3B, the solder resist layer 60 is formed on the lower surface of the insulating layer 20. This solder resist layer 60 has the opening 60x mainly exposing the pads 10a of the wiring layer 10. The copper film forming the support base 300 may be removed by a wet etching using ferric chloride solution, cupric chloride solution, ammonium persulfate, or the like. The solder resist layer 60 may be formed by a method similar to that used to form the solder resist layer 50. A metal layer may be formed by electroless plating or the like, for example, on the lower surface of the wiring layer 10 that is exposed at the opening 60x, if necessary. In addition, the oxidation preventing process may be performed on the lower surface of the wiring layer 10 that is exposed at the opening 60x. As described above, the pads 10a of the wiring layer 10 are adjacent to each other at the intervals in the range of several μm to ten-odd μm, for example. Hence, this embodiment provides one opening 60x in the solder resist layer 60, for example, to simultaneously expose the lower surface of each of the pads 10a of the wiring layer 10.

Figure 3C:
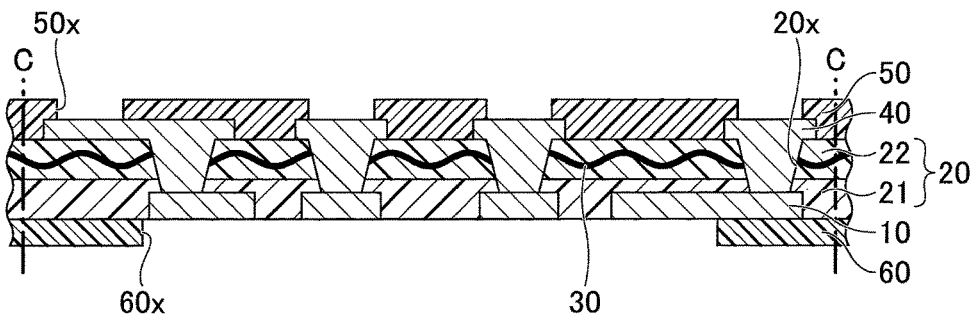

After the process illustrated in FIG. 3C, the structure illustrated in FIG. 3C is cut at cutting positions C by a slicer or the like, into a plurality of circuit boards 1 each having the configuration illustrated in FIGS. 1A and 1B. An external connecting terminal, such as a solder ball or the like, or an electronic component such as a chip capacitor or the like, for example, may be provided at least on one of the wiring layer 40 that is exposed within the opening 50x of the solder resist layer 50, and the wiring layer 10 that is exposed within the opening 60x of the solder resist layer 60, if necessary. In addition, the external connecting terminal may be provided, or the electronic component may be mounted, on the structure before being cut. In this case, the structure may be cut into the plurality of circuit boards 1 after providing the external connecting terminal or mounting the electronic component.

As described above, according to the circuit board 1 in the first embodiment, the outermost wiring layer 10 is embedded in the first insulator film 21 that is made of the reinforcement-free insulating resin having the relatively low melting viscosity. For this reason, even in a case in which the wiring layer 10 has a high wiring density or the wiring layer 10 has a high remaining copper rate, voids caused by insufficient filling by the insulating resin are unlikely to be generated, and the wiring layer 10 is unlikely to make contact with a reinforcing member (including the reinforcing member 30). As a result, the insulating reliability of the circuit board 1 can be improved.

In addition, the insulating layer 20 has the two-layer structure made up of the first insulator film 21 made of the reinforcement-free insulating resin, and the second insulator film 22 having the reinforcing member 30. Hence, the strength of the entire insulating layer 20 is approximately the same as that of the conventional prepreg, and a required strength of the circuit board 1 can be maintained.

When the wiring layer is embedded using the insulating layer having the reinforcing member as in the conventional case, the amount of resin usable for embedding the wiring layer is small for the insulating layer having the reinforcing member. Consequently, undulations or irregularities are easily generated on the upper surface of the insulating layer, to make it difficult to form the wiring layer on the upper surface of the insulating layer. On the other hand, according to this embodiment, the second insulator film 22 having the reinforcing member 30 is formed on the first insulator film 21, and the resin of the second insulator film 22 is not used for the embedding of the wiring layer 10. Hence, the upper surface of the second insulator film 22 becomes flat, and the wiring layer 40 can easily be formed on the upper surface of the second insulator film 22.

Properties of the first insulator film 21 and the second insulator film 22 can be set arbitrarily, and a degree of freedom of design of the circuit board 1 can be improved. For example, it is possible to select for the first insulator film 21 a resin having a superior adhesion property with respect to the wiring layer 10, a resin having a high insulation property (or a resin having a high migration resistance), and a resin having a particularly low melting viscosity. Selection of each of such resins for the first insulator film 21 can contribute to the improvement of the insulating reliability of the circuit board 1. Alternatively, the CTEs of the first insulator film 21 and the second insulator film 22 may be adjusted independently according to the filler content or the like, to facilitate reducing the warping of the entire circuit board 1.

Furthermore, according to this embodiment, not only the side surface of the wiring layer 10 but also the upper surface of the wiring layer 10 are covered by the first insulator film 21 that is made of the reinforcement-free insulating resin. For this reason, it is possible to sufficiently separate the distance between the wiring layer 10 and the reinforcing member 30 within the second insulator film 22, and improve the insulating reliability particularly under moisture adsorption.

Figure 4:
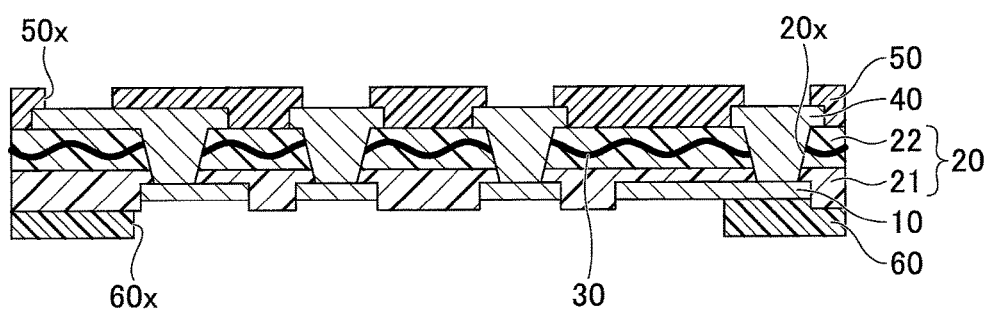
FIG. 4 is a diagram illustrating an example of the circuit board in the first embodiment.

In a case in which the support base 300 and the wiring layer 10 are made of the same metal (for example, copper) and the support base 300 is removed in the process illustrated in FIG. 3C, the lower surface of the wiring layer 10 is etched and the lower surface of the wiring layer 10 may cave in more than the lower surface of the first insulator film 21. In this case, a circuit board 1A having the structure illustrated in FIG. 4 is obtained. FIG. 4 is a diagram illustrating an example of the circuit board in the first embodiment. The performance of the circuit board 1A is approximately the same as that of the circuit board 1.

In addition, the manufacturing process of the circuit board 1 may be modified as follows. For example, in the process illustrated in FIG. 2C, a prepreg having a copper film may be stacked on the upper surface of the first insulator film 21, to form the second insulator film 22. In this case, the copper film is formed on the entire surface of one of the surfaces of the prepreg, and the prepreg is stacked on the upper surface of the first insulator film 21 in a state in which the copper film forms the upper surface of the prepreg. Alternatively, the prepreg and the copper film may be successively stacked on the upper surface of the first insulator film 21, to form the second insulator film 22.

As a result, in FIG. 2C, the first insulator film 21, the second insulator film 22, and the copper film are successively stacked in this order. Thereafter, in the process illustrated in FIG. 2D, the laser beam machining may be performed on the copper film, to form the via hole 20x in the insulating layer 20. Next, in the process illustrated in FIG. 3A, the wiring layer 40 may be formed by the semi-additive method or the subtractive method. In this case, the copper film remains as a part of the wiring layer 40.

In addition, the manufacturing process of the circuit board 1 may be modified as follows. For example, in the process illustrated in FIG. 2O, the second insulator film 22 may be stacked on the upper surface of the first insulator film 21, a prepreg and a copper film having a primer layer may be stacked on the upper surface of the second insulator film 22.

As a result, in FIG. 2C, the first insulator film 21, the second insulator film 22, the primer layer, and the copper film are successively stacked in this order. Thereafter, the copper film is removed. Next, in the process illustrated in FIG. 2D, the laser beam machining may be performed on the primer layer, to form the via hole 20x in the insulator layer 20. Next, in the process illustrated in FIG. 3A, the wiring layer 40 may be formed by the semi-additive method or the subtractive method. In this case, the primer layer remains as a part of the insulating layer 20. The primer layer may be made of a material similar to that of a third insulator film 23 which will be described later.

(First Modification of First Embodiment)

In a first modification of the first embodiment, the upper surface of the wiring layer 10 is exposed from the first insulator film 21. In the first modification of the first embodiment, a description of those parts that are the same as those of the first embodiment will be omitted.

Figure 5:
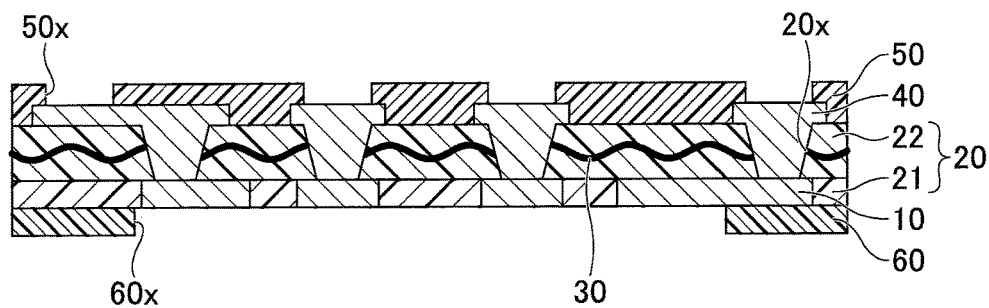
FIG. 5 is a cross sectional view illustrating an example of the circuit board in a first modification of the first embodiment.

FIG. 5 is a cross sectional view illustrating an example of the circuit board in the first modification of the first embodiment. A circuit board 2 in the first modification of the first embodiment illustrated in FIG. 5 differs from the circuit board 1 of the first embodiment illustrated in FIGS. 1A and 1B, in that the upper surface of the wiring layer 10 is exposed from the first insulator film 21 of the circuit board 2.

In other words, in the circuit board 2, the first insulator film 21 covers only the side surfaces of the wiring layer 10. The lower surface of the first insulator film 21 and the lower surface of the wiring layer 10 may match and form a single surface, for example. In addition, the upper surface of the first insulator film 21 and the upper surface of the wiring layer 10 may match and form a single surface, for example. In other words, the thickness of the first insulator film 21 may be the same as the thickness of the wiring layer 10. In addition, the upper surface of the wiring layer 10 is covered by the second insulator film 22, and a via wiring forming the wiring layer 40 connects to the upper surface of the wiring layer 10 through the via hole 20x that penetrates only the second insulator film 22.

When making the circuit board 2, the processes of the first embodiment illustrated in FIGS. 2A and 2B are first performed, to form the wiring layer 10 and the first insulator film 21 on the support base 300. Alternatively, the wiring layer 10 and the first insulator film 21 may be formed as follows. That is, a photosensitive epoxy insulating resin is provided on the upper surface of the support base 300, and the photosensitive epoxy insulating resin is patterned by exposing and developing the photosensitive epoxy insulating resin, to form openings that expose the upper surface of the support base 300 at parts where the wiring layer 10 is to be formed. Accordingly, the first insulator film 21 having the openings is made. The wiring layer 10 is formed on the upper surface of the support base 300 exposed within the openings in the first insulator film 21, by electroplating or the like, that uses the support base 300 as the plating feed layer.

Figure 6A:
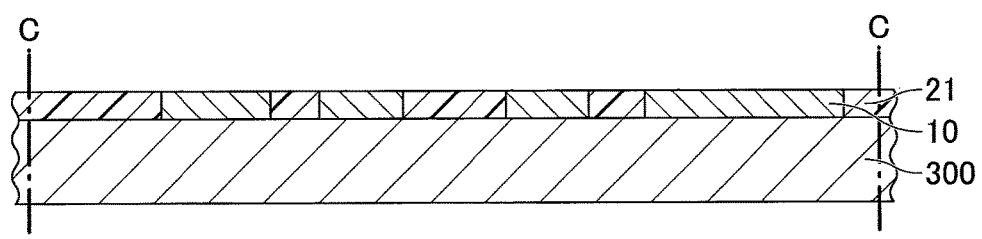
FIGS. 6A, 6B, and 6C are diagrams illustrating an example of the manufacturing processes of the circuit board in the first modification of the first embodiment.
Figure 6B:
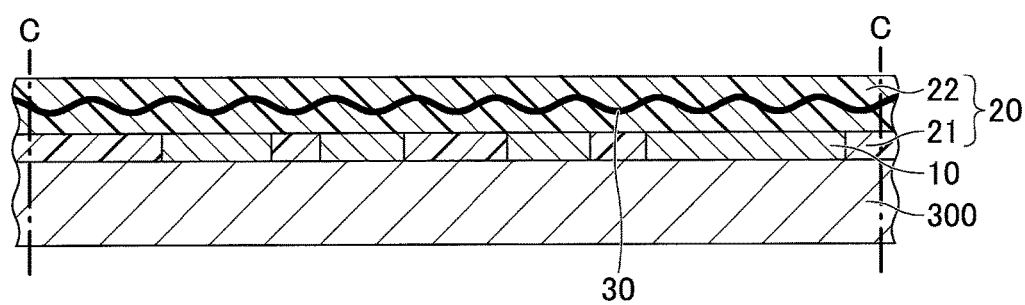
Figure 6C:
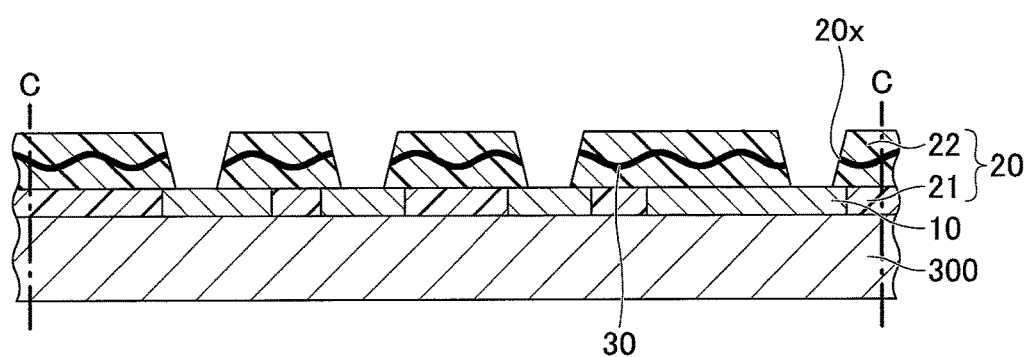

FIGS. 6A, 6B, and 6C are diagrams illustrating an example of the manufacturing processes of the circuit board in the first modification of the first embodiment.

Thereafter, in the process illustrated in FIG. 6A, the first insulator film 21 in the semi-cured state is pressed against the support base 300 by a plate or the like having a flat surface, to match the upper surface of the first insulator film 21 and the upper surface of the wiring layer 10. Alternatively, the upper part of the first insulator film 21 protruding above the wiring layer 10 is polished, to match the upper surface of the first insulator film 21 and the upper surface of the wiring layer 10.

Next, in the process illustrated in FIG. 63, the second insulator film 22 in the B-stage (or semi-cured state) is stacked on the upper surface of the first insulator film 21, in a manner similar to the process illustrated in FIG. 2C. After stacking the second insulator film 22 on the upper surface of the first insulator film 21, the first insulator film 21 and the second insulator film 22 are heated to a predetermined temperature and cured. The first and second insulator films 21 and 22 may be heated while applying pressure, if necessary. In this process illustrated in FIG. 63, unlike the process illustrated in FIG. 20, the upper surface of the wiring layer 10 is covered by the second insulator film 22.

Next, in the process illustrated in FIG. 6C, the via holes 20x that expose the upper surface of the wiring layer 10 are formed in a manner similar to the process illustrated in FIG. 2D. However, because the upper surface of the wiring layer 10 is covered by the second insulator film 22 in the first modification of the first embodiment, the via holes 20x that are formed penetrate only the second insulator film 22. In other words, the via holes 20x are not formed in the first insulator film 21. For this reason, unlike the case in which the via holes 20x are formed in both the first insulator film 21 and the second insulator film 22, it is unnecessary to take into consideration changing the laser irradiating condition, adjusting the conditions of the desmear process, or the like, and the manufacturing process can be simplified.

Thereafter, the processes of the first embodiment illustrated in FIGS. 3A through 3C are performed, and the structure is cut into a plurality of circuit boards 2 illustrated in FIG. 5 by the slicer or the like. An external connecting terminal, such as a solder ball or the like, or an electronic component such as a chip capacitor or the like, for example, may be provided at least on one of the wiring layer 40 that is exposed within the opening 50x of the solder resist layer 50, and the wiring layer 10 that is exposed within the opening 60x of the solder resist layer 60, if necessary. In addition, the external connecting terminal may be provided, or the electronic component may be mounted, on the structure before being cut. In this case, the structure may be cut into the plurality of circuit boards 2 after providing the external connecting terminal or mounting the electronic component.

(Second Modification of First Embodiment)

In a second modification of the first embodiment, the upper surface of the wiring layer 10 protrudes from the upper surface of the first insulator film 21. In the second modification of the first embodiment, a description of those parts that are the same as those of the first embodiment and the first modification will be omitted.

Figure 7:
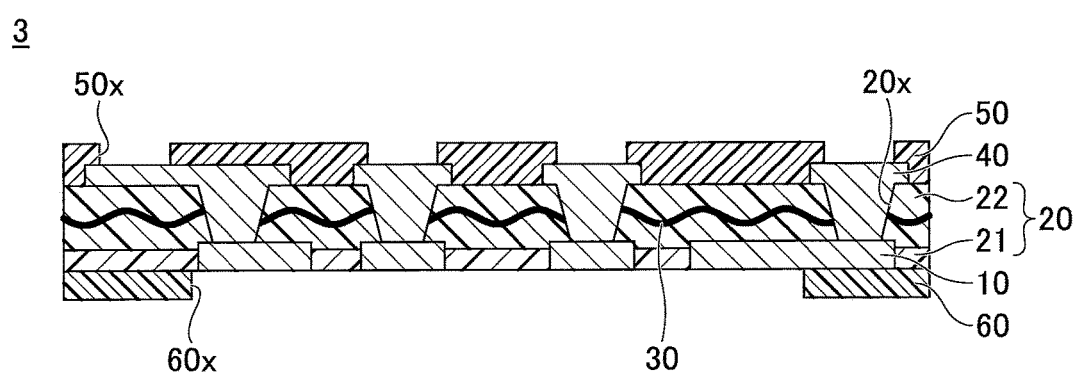
FIG. 7 is a cross sectional view illustrating the circuit board in a second modification of the first embodiment.

FIG. 7 is a cross sectional view illustrating the circuit board in the second modification of the first embodiment. A circuit board 3 in the second modification of the first embodiment illustrated in FIG. 7 differs from the circuit board 1 of the first embodiment illustrated in FIGS. 1A and 1B, in that the upper surface of the wiring layer 10 protrudes from the upper surface of the first insulator film 21 of the circuit board 3.

In other words, in the circuit board 3, the first insulator film 21 covers only the lower side of the side surfaces of the wiring layer 10. The lower surface of the first insulator film 21 and the lower surface of the wiring layer 10 may match to form a single surface. In addition, the upper side of the side surfaces of the wiring layer 10 and the upper surface of the wiring layer 10 are covered by the second insulator film 22.

Figure 8:
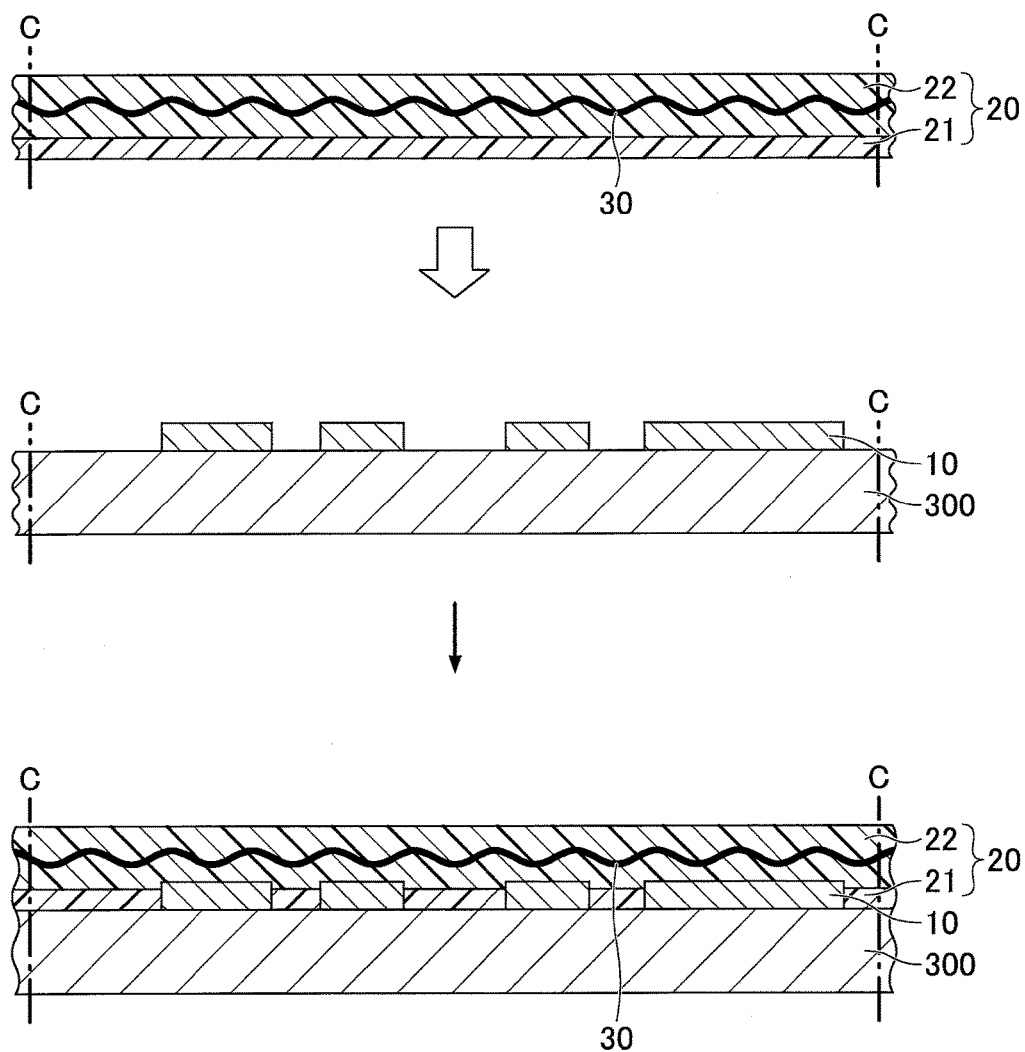
FIG. 8 is a diagram illustrating an example of the manufacturing processes of the circuit board in the second modification of the first embodiment.

When making the circuit board 3, the processes illustrated in FIG. 8 is first performed. FIG. B is a diagram illustrating an example of the manufacturing processes of the circuit board in the second modification of the first embodiment. In the processes illustrated in FIG. 8, the insulator layer 20 in the B-stage (or semi-cured state) having the prestacked first insulator film 21 and the second insulator film 22 is prepared, as illustrated in a top part of FIG. 8. In addition, the process of the first embodiment illustrated in FIG. 2A is performed, in parallel to the processes illustrated in FIG. 8, to form the wiring layer 10 on the upper surface of the support base 300, as illustrated in a middle part of FIG. 8.

Then, the first insulator film 21 is oriented to face the support base 300, and the insulating layer 20 is adhered (or laminated) on the upper surface of the support base 300 to cover the wiring layer 10. Further, the first insulator film 21 and the second insulator film 22 are heated to a predetermined temperature and cured. The first and second insulator films 21 and 22 may be heated while applying pressure, if necessary. By presetting the thickness of the first insulator film 21 thinner than the thickness of the wiring layer 10, the structure in which the upper surface of the wiring layer 10 protrudes from the upper surface of the first insulator film 21 can be obtained, as illustrated in a bottom part of FIG. 8. However, a protruding amount of the wiring layer 10 needs to be set to such an amount that the upper surface of the wiring layer 10 does not make contact with the reinforcing member 30.

In the processes illustrated in FIG. 8, by appropriately adjusting the thickness of the first insulator film 21, it is possible to make the circuit boards having the structures illustrated in FIGS. 1A and 1B and FIG. 5. In addition, depending on the thickness of the first insulator film 21, the structure illustrated in FIGS. 1A and 1B, the structure illustrated in FIG. 5, and the structure illustrated in FIG. 7 may coexist within a single circuit board, and advantageous features obtainable by this single circuit board are similar to those obtainable by each of such structures.

Figure 9A:
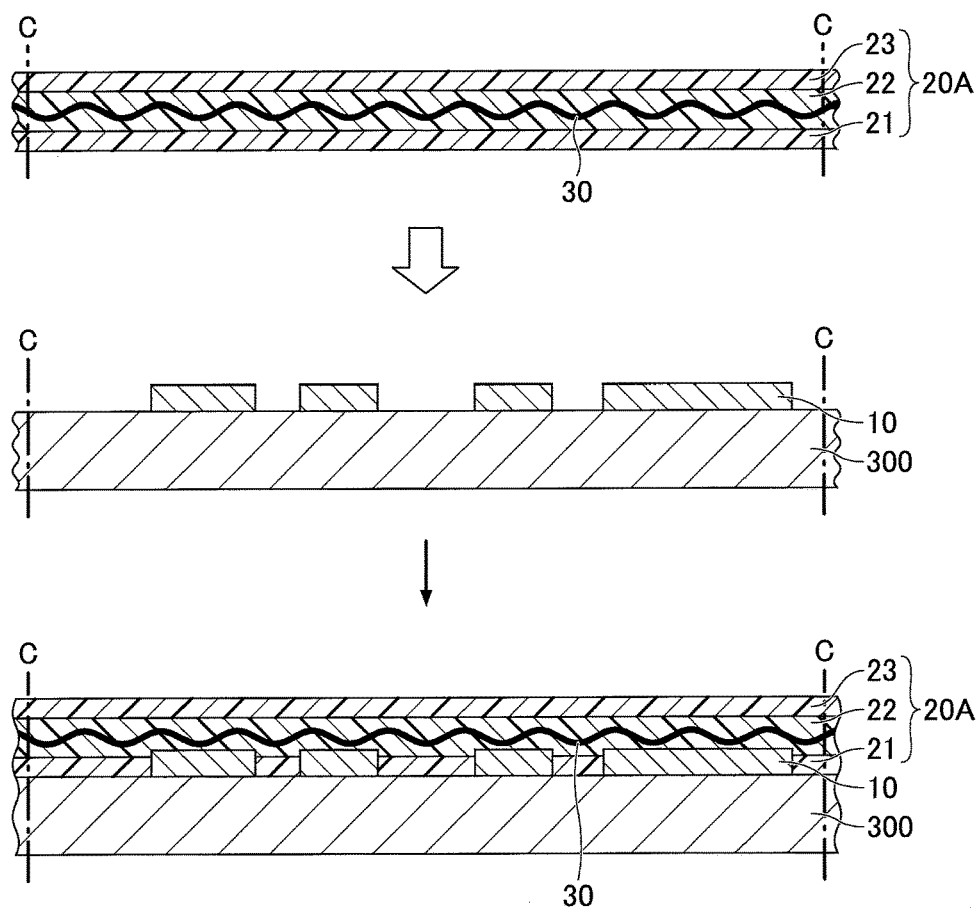
FIGS. 9A and 9B are diagrams illustrating an example of the manufacturing processes of the circuit board in the second modification of the first embodiment.

Further, it is possible to use an insulating layer 20A having a three-layer structure illustrated in a top part of FIG. 9A, in place of the insulating layer 20 illustrated in FIG. 8. The insulating layer 20A has a structure in which the third insulator film 23 is further stacked on the second insulator film 22 of the insulating layer 20. The third insulator film 23 includes no reinforcing member, and is sometimes also referred to as a primer layer.

In the insulating layer 20 having the second insulator film 22 that includes the reinforcing member 30, there are cases in which electroless plating on the upper surface of the second insulator film 22 is difficult due to the existence of the reinforcing member 30. In such cases, the wiring layer forming method that uses the electroless plating, such as the semi-additive method or the like, cannot be employed. Hence, in the top part of FIG. 9A, the third insulator film 23 is stacked on the upper surface of the second insulator film 22, to enable electroless plating on an upper surface of the third insulator film 23. As a result, a wiring layer can be formed on the upper surface of the third insulator film 23 by the semi-additive method, for example.

An insulating resin similar to that used for the second insulator film 22 may be used for the third insulator film 23, however, composition of the insulating resin may be adjusted to facilitate the electroless plating. The third insulator film 23 may have a thickness in a range of 1 μm to 10 μm, for example.

Figure 9B:
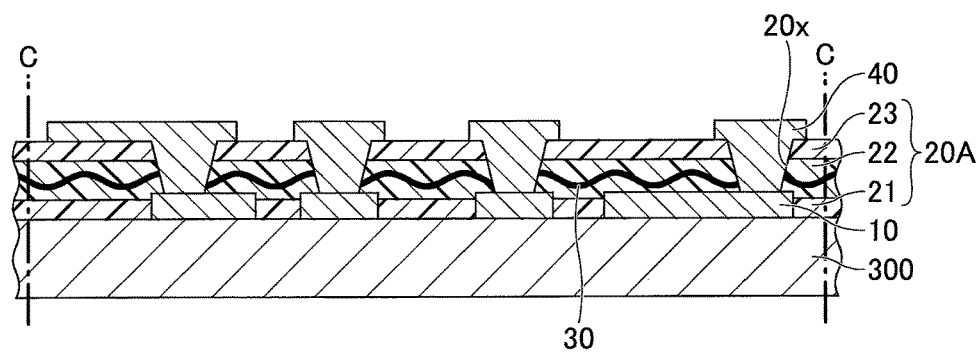

When making a circuit board 3A, the processes illustrated in FIG. 9A is first performed. FIGS. 9A and 9B are diagrams illustrating an example of the manufacturing processes of the circuit board in the second modification of the first embodiment. In the processes illustrated in FIG. 9A, the insulator layer 20A in the B-stage (or semi-cured state) having the prestacked first insulator film 21, the second insulator film 22, and the third insulator film 23 is prepared, as illustrated in a top part of FIG. 9A. In addition, the process of the first embodiment illustrated in FIG. 2A is performed, in parallel to the processes illustrated in FIG. 9A, to form the wiring layer 10 on the upper surface of the support base 300, as illustrated in a middle part of FIG. 9A.

Then, the first insulator film 21 is oriented to face the support base 300, and the insulating layer 20A is adhered (or laminated) on the upper surface of the support base 300 to cover the wiring layer 10. Further, the first insulator film 21, the second insulator film 22, and the third insulator film 23 are heated to a predetermined temperature and cured. The first, second, and third insulator films 21, 22, and 23 may be heated while applying pressure, if necessary. By presetting the thickness of the first insulator film 21 thinner than the thickness of the wiring layer 10, the structure in which the upper surface of the wiring layer 10 protrudes from the upper surface of the first insulator film 21 can be obtained, as illustrated in a bottom part of FIG. 9A.

Thereafter, by performing processes similar to the processes of the first embodiment described above with reference to FIGS. 2D and 3A, the wiring layer 40 is formed as illustrated in FIG. 9B. In a case in which the wiring layer 40 is formed by the semi-additive method, a seed layer made of copper (Cu) or the like is first formed by electroless plating on the upper surface of the wiring layer 10 exposed at the bottom of the via holes 20x, and on the insulating layer 20A, including the inner wall surfaces defining the via holes 20x. Further, a resist layer having openings corresponding to the wiring layer 40 is formed on the seed layer.

Next, a wiring layer made of copper (Cu) or the like is formed in the openings of the resist layer, by electroplating that uses the seed layer as a plating feed layer. Then, after removing the resist layer, the wiring layer is used as a mask, and an etching is performed to remove parts of the seed layer not covered by the wiring layer. As a result, the wiring layer 40, including via wirings filling the via holes 20x and wiring patterns formed on the upper surface of the third insulator film 23, is formed on the insulating layer 20A.

Figure 10:
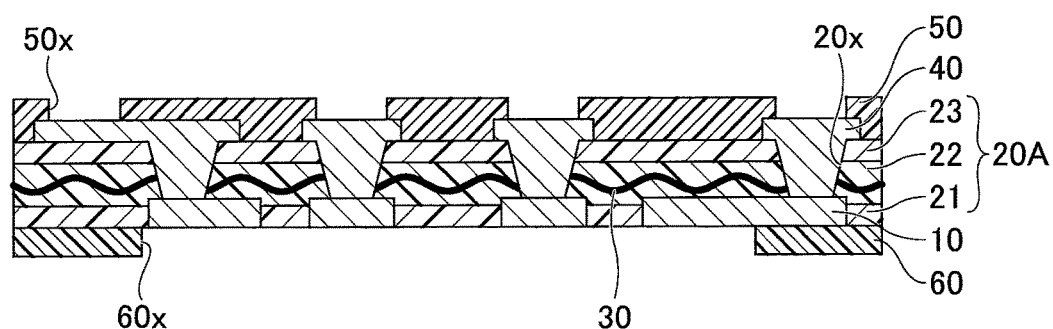
FIG. 10 is a cross sectional view illustrating an example of the circuit board in the second modification of the first embodiment.

After the process illustrated in FIG. 9B, the processes of the first embodiment illustrated in FIGS. 3B and 3C are performed, and the structure is cut into a plurality of circuit boards 3A illustrated in FIG. 10 by the slicer or the like. FIG. 10 is a cross sectional view illustrating an example of the circuit board in the second modification of the first embodiment. An external connecting terminal, such as a solder ball or the like, or an electronic component such as a chip capacitor or the like, for example, may be provided at least on one of the wiring layer 40 that is exposed within the opening 50x of the solder resist layer 50, and the wiring layer 10 that is exposed within the opening 60x of the solder resist layer 60, if necessary. In addition, the external connecting terminal may be provided, or the electronic component may be mounted, on the structure before being cut. In this case, the structure may be out into the plurality of circuit boards 3A after providing the external connecting terminal or mounting the electronic'component.

In other embodiments and modifications, the third insulator film 23 may be stacked on the second insulator film 22, and the wiring layer may be formed by the semi-additive method. In other words, in each of the circuit board 1 illustrated in FIGS. 1A and 1B, the circuit board 1A illustrated in FIG. 4, the circuit board 2 illustrated in FIG. 5, and a circuit board 4 illustrated in FIG. 11 which will be described later, it is possible to use the insulating layer 20A in place of the insulating layer 20.

(Second Embodiment)

In a second embodiment, the circuit board has a three-layer structure. In the second embodiment, a description of those parts that are the same as those of the first embodiment will be omitted.

Figure 11:
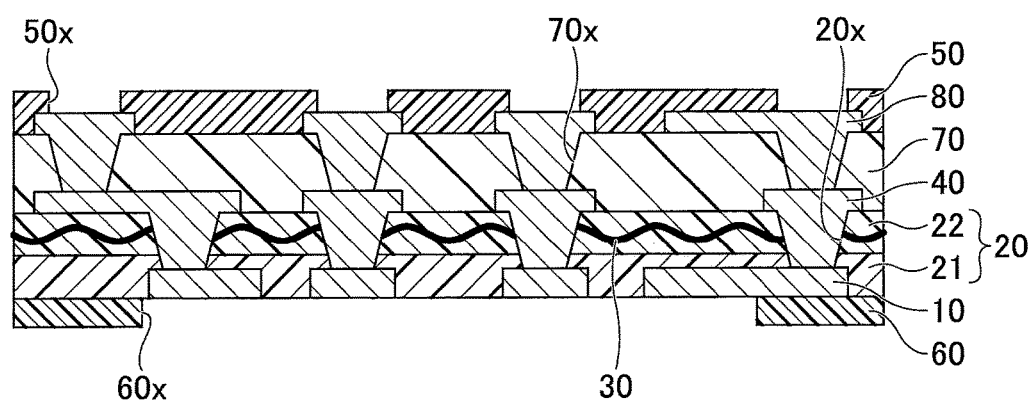
FIG. 11 is a cross sectional view illustrating an example of the circuit board in a second embodiment.

FIG. 11 is a cross sectional view illustrating an example of the circuit board in the second embodiment. As illustrated in FIG. 11, the circuit board 4 in the second embodiment differs from the circuit board 1 of the first embodiment illustrated in FIGS. 1A and 1B, in that an insulating layer 70 and a wiring layer 80 are inserted between the wiring layer 40 and the solder resist layer 50 of the circuit board 4.

The insulating layer 70 is formed on the upper surface of the insulating layer 20, to cover the wiring layer 40. The insulating layer 70 may be made of an epoxy insulating resin, for example. The insulating layer 70 may include a filler such as silica ($SiO_2$) or the like. The insulating layer 70 may have a thickness in a range of 15 μm to 35 μm, for example.

The insulating layer 70 may have a stacked structure including a first insulator film 21 and a second insulator film 22. In this case, the insulating layer 70 having the stacked structure that includes the first and second insulator films 21 and 22, is stacked on the insulating layer 20 having the stacked structure that includes the first and second insulator films 21 and 22. Alternatively, the insulating layer 70 may includes a reinforcing member. In this case, the insulating resin and the reinforcing member forming the insulating layer 70 may be made of materials similar to those used for the second insulator film 22 and the reinforcing member 30.

The wiring layer 80 is an example of a third wiring layer, and is formed on the insulating layer 70. The insulating layer 80 includes via wirings filling via holes 70x penetrating the insulating layer 70 and exposing the upper surface of the wiring layer 40, and wiring patterns formed on an upper surface of the insulating layer 70. An opening of the via hole 70x on the side of the solder resist layer 50 has a larger diameter than an opening of the via hole 70x at the upper surface of the wiring layer 40, and the via hole 20x forms a recess having an inverted cone shape.

The wiring layer 80 is electrically connected to the wiring layer 40 that is exposed at a bottom part of the via hole 70x. For example, the wiring layer 80 may be made of copper (Cu) or the like. The wiring patterns of the wiring layer 80 may have a thickness in a range of 1 µm to 35 µm, for example.

The solder resist layer 50 is formed on the upper surface of the insulating layer 70, to cover the wiring layer 80. The solder resist layer 50 has an opening 50x, and a part of the wiring layer 80 is exposed at the bottom part of the opening 50x. The wiring layer 80 exposed at the bottom part of the opening 50x may function as a pad that electrically connects to another circuit board, a semiconductor package, a semiconductor chip, or the like. The material and the thickness of the solder resist layer 50 may be the same as those described above.

Figure 12A:
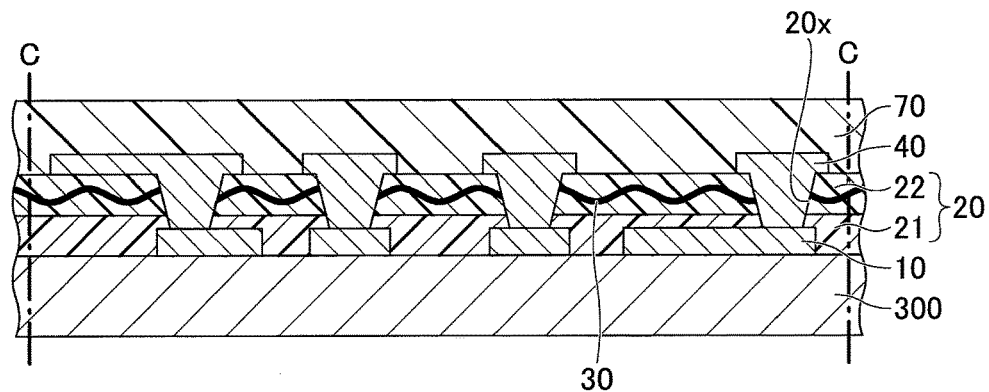
FIGS. 12A, 12B, and 12C are diagrams illustrating an example of the manufacturing processes of the circuit board in the second embodiment.
Figure 12B:
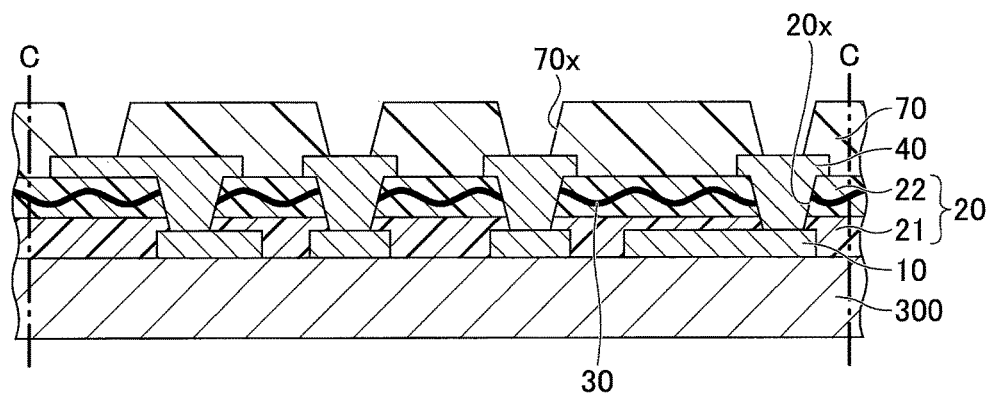
Figure 12C:
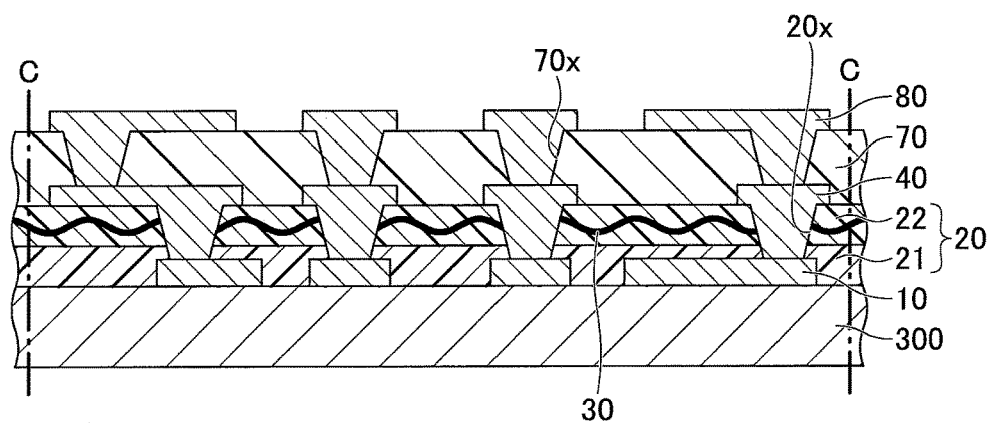

When making the circuit board 4, the processes of the first embodiment illustrated in FIGS. 2A through 3A are first performed. Thereafter, in a process illustrated in FIG. 12A, a thermosetting epoxy insulating resin or the like in film form, for example, is laminated on the insulating layer 20 to cover the wiring layer 40. FIGS. 12A, 12B, and 12C are diagrams illustrating an example of the manufacturing processes of the circuit board in the second embodiment. Alternatively, a thermosetting epoxy insulating resin or the like in liquid form or paste form, for example, is coated on the insulating layer 20 to cover the wiring layer 40, using screen printing, spin-coating, or the like. The insulating resin that is laminated or coated is heated to a curing temperature or higher and cured, to form the insulating layer 70. The insulating layer 70 may be heated while applying pressure, if necessary.

Next, in a process illustrated in FIG. 12B, the via holes 70x that penetrate the insulating layer 70 and expose the upper surface of the wiring layer 40 are formed in the insulating layer 70 in a manner similar to the process of the first embodiment illustrated in FIG. 2D. In a case in which the via holes 70x are formed by laser beam machining, a desmear process is preferably performed to remove residual resin of the insulating layer 20, adhered to the upper surface of the wiring layer 40 exposed at the bottom part of the via holes 70x.

Next, in a process illustrated in FIG. 12C, the wiring layer 80 is formed on the insulating layer 70 in a manner similar to the process of the first embodiment illustrated in FIG. 3A. Thereafter, the processes of the first embodiment illustrated in FIGS. 3B and 3C are performed, and the structure is cut into a plurality of circuit boards 4 illustrated in FIG. 11 by the slicer or the like. An external connecting terminal, such as a solder ball or the like, or an electronic component such as a chip capacitor or the like, for example, may be provided at least on one of the wiring layer 80 that is exposed within the opening 50x of the solder resist layer 50, and the wiring layer 10 that is exposed within the opening 60x of the solder resist layer 60, if necessary. In addition, the external connecting terminal may be provided, or the electronic component may be mounted, on the structure before being cut. In this case, the structure may be cut into the plurality of circuit boards 4 after providing the external connecting terminal or mounting the electronic component.

Accordingly, the circuit board 4 having the three-layer structure can be made by stacking the insulating layer 70 and the wiring layer 80 on the wiring layer 40. Of course, a circuit board having an N-layer structure can be made by alternately stacking a required number of insulator layers and wiring layers on the wiring layer 40, where N is a natural number greater than or equal to 4. In this case, one or more insulating layers stacked on the wiring layer 40 may have a stacked structure including a first insulator film 21 and a second insulator film 22, so as to further improve the insulating reliability.

(First Application of Circuit Board)

In a first application of the circuit board, a semiconductor chip is mounted (flip-chip bonded) on the circuit board of the first embodiment and the circuit board of the second embodiment, to form examples of semiconductor packages. In this first application, a description of those parts that are the same as those of the first and second embodiments will be omitted.

Figure 13A:
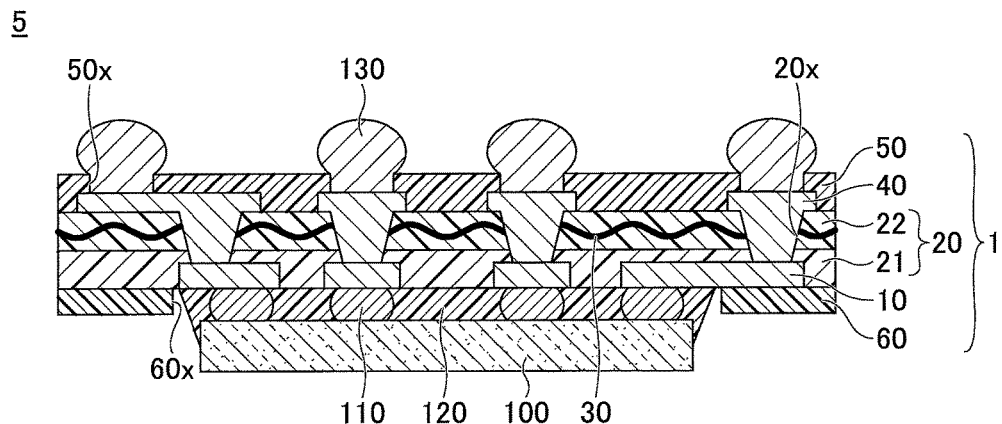
FIGS. 13A and 13B are cross sectional views illustrating examples of semiconductor packages in a first application.
Figure 13B:
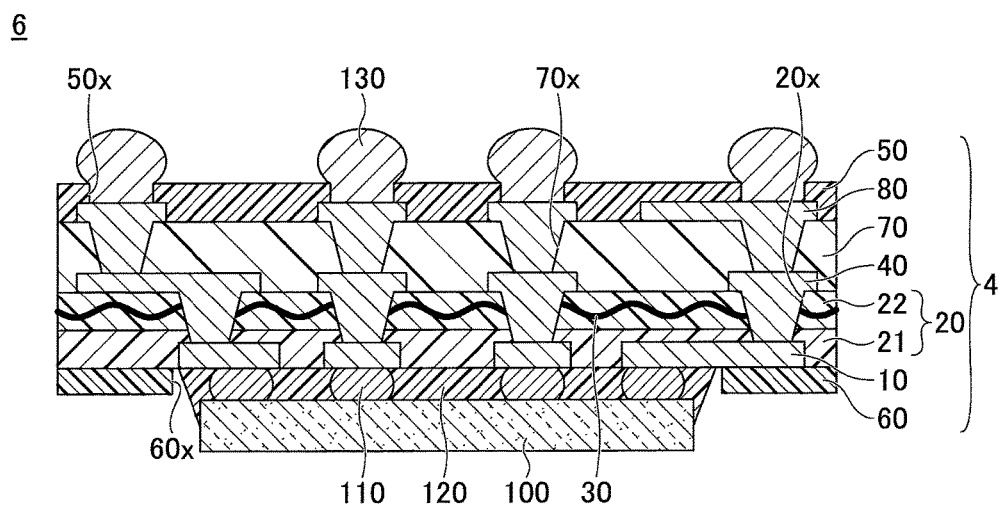

FIGS. 13A and 13B are cross sectional views illustrating examples of semiconductor packages in the first application. As illustrated in FIG. 13A, a semiconductor package 5 includes a circuit board 1 illustrated in FIGS. 1A and 1B, a semiconductor chip 100, bumps 110, an underfill resin 120, and bumps 130. In the semiconductor package 5, the side of the first insulator film 21 of the circuit board 1 forms a chip mounting surface on which the semiconductor chip 100 is mounted. On the other hand, the side of the solder resist layer 50 of the circuit board 1 forms a terminal surface on which external connecting terminals are formed.

The semiconductor chip 100 includes a semiconductor integrated circuit (not illustrated) or the like formed on a thin semiconductor substrate (not illustrated) that is made of silicon or the like, for example. Electrode pads (not illustrated) that electrically connect to the semiconductor integrated circuit are formed on the semiconductor substrate.

The bumps 110 electrically connect the electrode pads of the semiconductor chip 100 and the wiring layer 10 that is exposed at the openings 60x of the solder resist layer 60 of the circuit board 1. The underfill resin 120 fills a gap between the semiconductor chip 100 and the circuit board 1 (first insulator film 21). The bumps 130 form external connecting terminals formed on the upper surface of the wiring layer 40 exposed at the bottom part of the openings 50x in the solder resist layer 50. For example, the bumps 130 electrically connect to another circuit board (mother board or the like), another semiconductor package, or the like. The bumps 110 and 130 are solder bumps, for example. The solder bumps may be made of a material such as an alloy including Pb, an alloy of Sn and Cu, an alloy of Sn and Ag, an alloy of Sn, Ag, and Cu, or the like.

Accordingly, the semiconductor package 5 can be obtained by mounting the semiconductor chip 100 on the circuit board 1 of first embodiment. Similarly, a semiconductor package 6 illustrated in FIG. 13B can be obtained by mounting the semiconductor chip 100 on the circuit board 4 of the second embodiment. Of course, any of the circuit boards 1A, 2, 3, and 3A may be used in place of the circuit board 1 or the circuit board 4.

By selecting a resin that is satisfactorily compatible with the underfill resin 120 for use as the resin forming the first insulator film 21, it is possible to improve a filling characteristic of the underfill resin 120.

In the examples illustrated in FIGS. 13A and 13B, the semiconductor chip 100 is mounted on the side of the wiring layer 10, and the bumps 130 are provided on the wiring layer 40 or the wiring layer 80. However, the semiconductor chip 100 may be mounted on the side of the wiring layer 40 or the wiring layer 80, and the bumps 130 may be provided on the wiring layer 10.

(Second Application of Circuit Board)

In a second application of the circuit board, a semiconductor package is mounted on another semiconductor package, to form an example of a semiconductor package having the so-called POP (Package On Package) structure. In this second application, a description of those parts that are the same as those of the first and second embodiments will be omitted.

Figure 14:
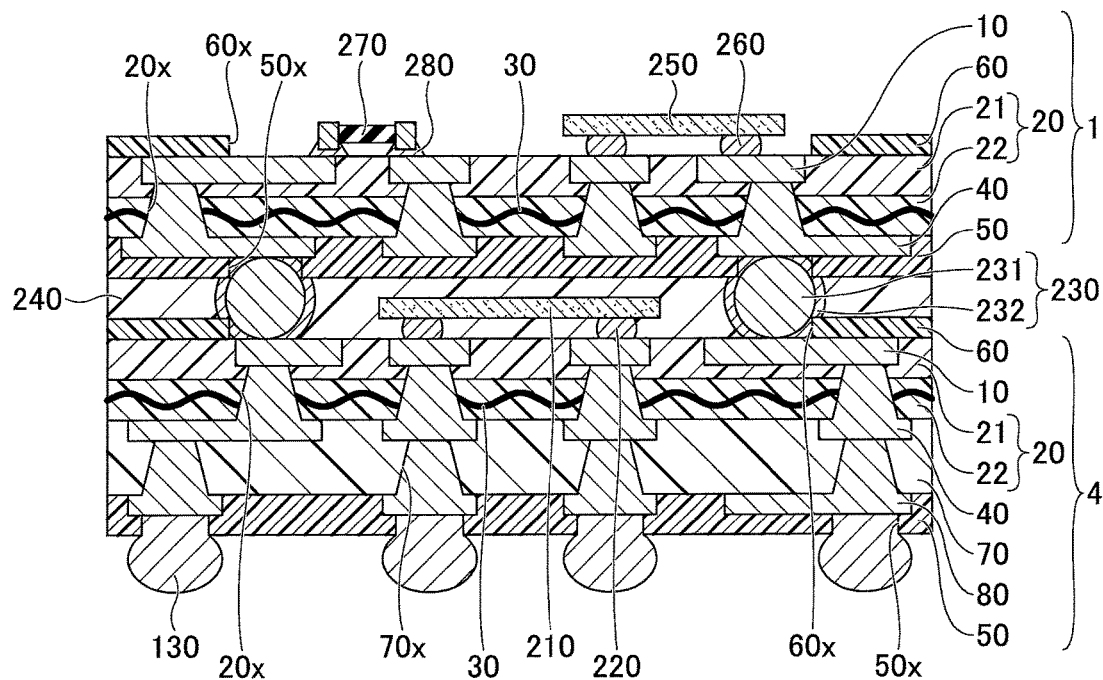
FIG. 14 is a cross sectional view illustrating an example of the semiconductor package in a second application.

FIG. 14 is a cross sectional view illustrating an example of the semiconductor package in the second application. A semiconductor package 7 illustrated in FIG. 14 includes a first semiconductor package including the circuit board 4, and a second semiconductor package including the circuit board 1 and mounted on the first semiconductor package.

In the first semiconductor package, a semiconductor chip 210 is mounted via bumps 220 on the side of the insulating layer 20 of the circuit board 4, and the bumps 130 are formed on the wiring layer 80 exposed at the openings 50x of the solder resist layer 50. On the other hand, in the second semiconductor package, a semiconductor chip 250 is mounted via bumps 160 on the side of the insulator layer 20 of the circuit board 1, and a chip capacitor 270 is mounted via bumps 280.

The first semiconductor package and the second semiconductor package are connected via solder balls 230 having a structure in which a periphery of a copper core ball 231 is covered by solder 232. More particularly, the wiring layer 10 of the circuit board 4 forming the first semiconductor package and the wiring layer 40 of the circuit board 1 forming the second semiconductor package are connected via the solder balls 230.

The solder balls 230 function as a bonding material that connects (or bonds) the first and second semiconductor packages, and also function as a spacer that maintains the distance (or separation) between the first and second semiconductor packages to a prescribed value. In other words, the solder 232 functions as the bonding material, and the copper core ball 231 functions as the spacer. A height of the solder balls 230 is set higher than a combined height that is obtained by adding the thickness of the semiconductor chip 210 and the thickness of the bumps 220.

An encapsulating resin 240 fills a space between the circuit board 1 and the circuit board 4. By filling the space by the encapsulating resin 240, the circuit board 1 becomes fixed with respect to the circuit board 4, and the semiconductor chip 210 mounted on the circuit board 4 becomes encapsulated by the encapsulating resin 240. In other words, the encapsulating resin 240 functions as a bonding agent that bonds the first and second semiconductor packages, and also functions as a protection layer that protects the semiconductor chip 210. In addition, by providing the encapsulating resin 240, it becomes possible to improve a mechanical strength of the entire semiconductor package 7.

The semiconductor package 7 having the POP structure mounted with an active component (for example, the semiconductor chip 210 or the like) and a passive component (for example, the chip capacitor 270) can be obtained, using the circuit board 1 of the first embodiment and the circuit board 4 of the second embodiment. Of course, any of the circuit boards 1A, 2, 3, and 3A may be used in place of the circuit board 1 or the circuit board 4.

(Third Embodiment)

In a third embodiment, the circuit board has micro wirings. In the third embodiment, a description of those parts that are the same as those of the first and second embodiments will be omitted.

[Structure of Circuit Board in Third Embodiment]

Figure 15:
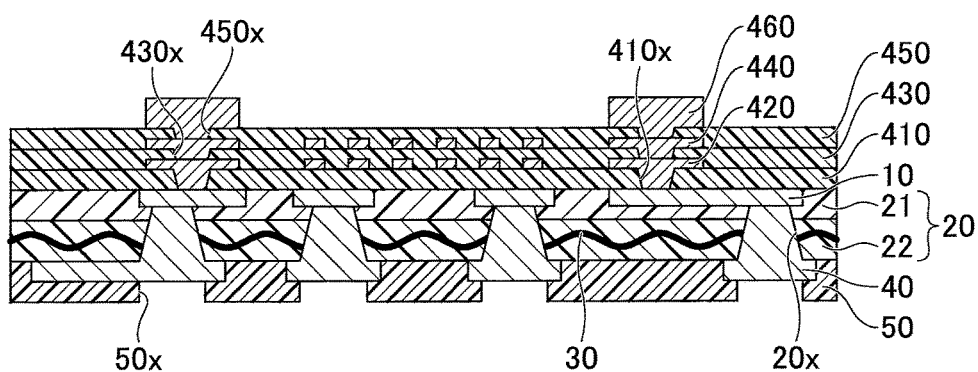
FIG. 15 is a cross sectional view illustrating an example of the circuit board in a third embodiment.

First, a description will be given of the structure of the circuit board in the third embodiment. FIG. 15 is a cross sectional view illustrating an example of the circuit board in the third embodiment. As illustrated in FIG. 15, a circuit board 8 in the third embodiment has a structure in which an insulating layer 410, a wiring layer 420, an insulating layer 430, a wiring layer 440, an insulating layer 450, and a wiring layer 460 are successively stacked on the insulating layer 20 of the circuit board 1 of the first embodiment illustrated in FIGS. 1A and 1B. FIG. 15 illustrates the circuit board 8 in a state in which the wiring layer 10, the insulating layer 20, or the like are arranged upside-down compared to the structure of the circuit board 1 illustrated in FIG. 1A.

Thicknesses of the insulating layers 410, 430, and 450 are thinner than the thickness of the insulating layer 20. In addition, thicknesses of wiring patterns forming the wiring layers 420 and 440 are thinner than the thicknesses of the wiring patterns forming the wiring layers 10 and 40. The wiring patterns forming the wiring layers 420 and 440 are formed with a density that is higher than the density of the wiring patterns forming the wiring layers 10 and 40. In other words, the wiring patterns forming the wiring layers 420 and 440 are micro wirings compared to the wiring patterns forming the wiring layers 10 and 40. A solder resist layer (not illustrated) may be provided on the insulating layer 450, and pads exposed through openings in the solder resist layer may form the wiring layer 460.

In the circuit board 8, the other surface of the wiring layer 10 and the other surface of the insulating layer 20 (other surface of the first insulator film 21) are polished to a flat surface. The insulating layer 410 is formed on the flat surface that is formed by the other surface of the wiring layer 10 and the other surface of the insulating layer 20. The insulating layer 410 may be made of a thermosetting photosensitive insulating resin including, as a main component, an epoxy resin, a phenol resin, or the like, for example. The insulating layer 410 may include a filler such as silica ($SiO_2$) or the like. The insulating layer 410 may have a thickness in a range of 3 μm to 30 μm, for example.

The wiring layer 420 is formed on the other surface of the insulating layer 410. The wiring layer 420 includes via wirings and wiring patterns. The via wirings fill via holes 410x that penetrate the insulating layer 410 and expose the upper surface of the wiring layer 10. The wiring patterns are formed on the other surface of the insulating layer 410. An opening of the via hole 410x on the side of the insulating layer 430 has a larger diameter than an opening of the via hole 410x at the other surface of the wiring layer 10, and the via hole 410x forms a recess having an inverted cone shape. The wiring layer 420 electrically connects to the wiring layer 10 through the via holes 410x. The wiring layer 420 may be made of copper (Cu) or the like, for example. The wiring layer 420 may have a thickness in a range of 1 μm to 3 μm, for example.

The insulating layer 430 is formed on the other surface of the insulating layer 410, to cover the wiring layer 420. For example, the material and the thickness of the insulating layer 430 may be the same as those of the insulating layer 410 described above.

The wiring layer 440 is formed on the other surface of the insulating layer 430. The wiring layer 440 includes via wirings and wiring patterns. The via wirings fill via holes 430x that penetrate the insulating layer 430 and expose the upper surface of the wiring layer 420. The wiring patterns are formed on the other surface of the insulating layer 430. An opening of the via hole 430x on the side of the insulating layer 450 has a larger diameter than an opening of the via hole 430x at the other surface of the wiring layer 420, and the via hole 430x forms a recess having an inverted cone shape. The wiring layer 440 electrically connects to the wiring layer 420 through the via holes 430x. For example, the material and the thickness of the wiring layer 440 may be the same as those of the wiring layer 420 described above.

The insulating layer 450 is formed on the other surface of the insulating layer 430, to cover the wiring layer 440. For example, the material and the thickness of the insulating layer 450 may be the same as those of the insulating layer 410 described above.

The wiring layer 460 is formed on the other surface of the insulating layer 450. The wiring layer 460 includes via wirings and wiring patterns. The via wirings fill via holes 450x that penetrate the insulating layer 450 and expose the upper surface of the wiring layer 440. The wiring patterns are formed on the other surface of the insulating layer 450. An opening of the via hole 450x on the side opening outside the circuit board 8 has a larger diameter than an opening of the via hole 450x at the other surface of the wiring layer 440, and the via hole 450x forms a recess having an inverted cone shape. The wiring layer 460 electrically connects to the wiring layer 440 through the via holes 450x.

The wiring layer 460 may be made of the same material as the wiring layer 420, for example. The wiring layer 460 may have a thickness of approximately 10 μm, for example. This thickness of the wiring layer 460 includes the pad part protruding from the other surface of the insulating layer 450. The planar shape of the pads forming the wiring layer 460 may be circular having a radius in a range of 20 μm to 30 μm, for example. The pads forming the wiring layer 460 function as pads that electrically connect to the semiconductor chip or the like. A metal layer may be formed on, or an oxidation preventing process may be performed on the surface of the pads forming the wiring layer 460. The surface of the pads subjected to the metal layer forming or the oxidation preventing process may include only the upper surface of the pads or the upper and side surfaces of the pads forming the wiring layer 460.

[Method of Manufacturing Circuit Board in Third Embodiment]

Next, a description will be given of the method of manufacturing the circuit board in the third embodiment. FIGS. 16A, 16B, and 16C and FIGS. 17A, 17B, and 17C are diagrams illustrating examples of the manufacturing processes of the circuit board in the third embodiment. In this embodiment, parts that become a plurality of circuit boards are made on a support base, and the support base is removed before separating the parts to form the plurality of circuit boards. However, it is possible to make the circuit board, one by one on the support base, and remove the support base to obtain each circuit board.

Figure 16A:
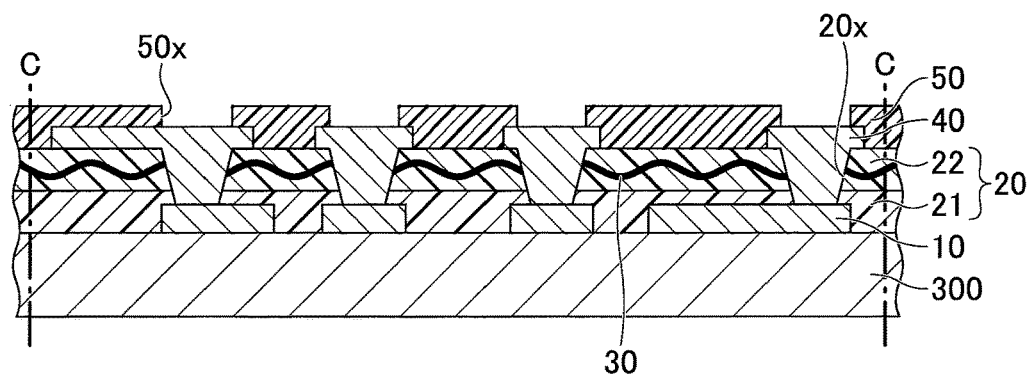
FIGS. 16A, 16B, and 16C are diagrams illustrating examples of the manufacturing processes of the circuit board in the third embodiment.

First, in FIG. 16A, processes similar to the processes of the first embodiment illustrated in FIGS. 2A through 3B are performed to form the wiring layer 10, the insulating layer 20, the wiring layer 40, and the solder resist layer 50 on the support base 300.

Figure 16B:
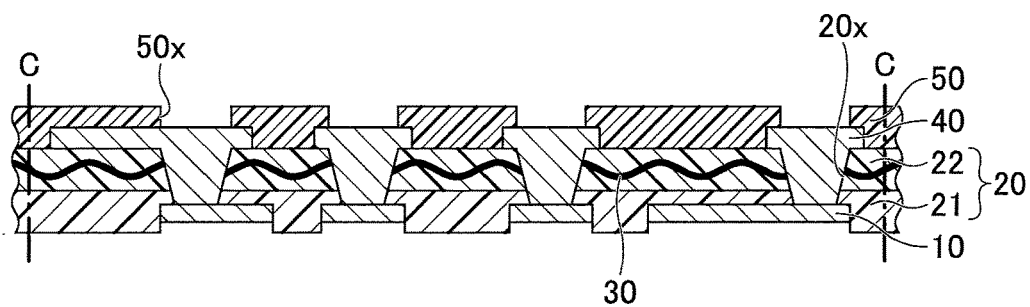

Next, in FIG. 16B, the support base 300 illustrated in FIG. 16A is removed by performing a process similar to the process of the first embodiment illustrated in FIG. 3C. In a case in which the support base 300 and the wiring layer 10 are made of the same metal (for example, copper or the like), the other surface of the wiring layer 10 is etched and the other surface of the wiring layer 10 may cave in more than the other surface of the first insulator film 21.

Figure 16C:
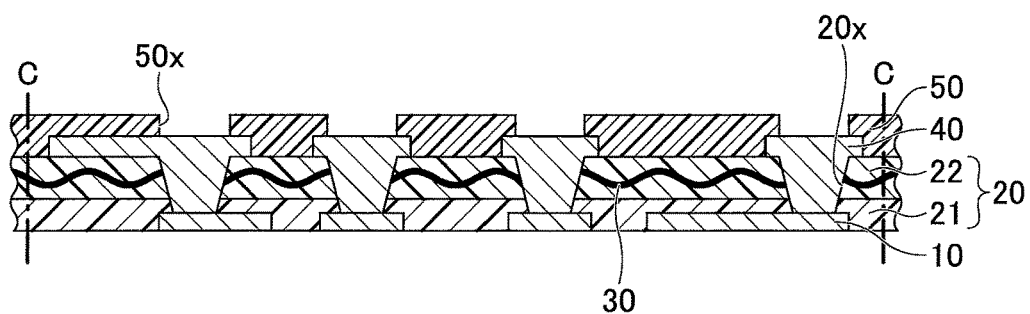

In a process illustrated in FIG. 16C, the other surface of the insulating layer 20 (other surface of the first insulator film 21) of the structure illustrated in FIG. 16B is polished by CMP (Chemical Mechanical Polishing) or the like. A part of the other surface of the wiring layer 10 may be polished simultaneously as the other surface of the insulating layer 20. In this case, the other surface of the wiring layer 10 and the other surface of the insulting layer 20 match and form a single flat surface. Because the first insulator film 21 of the insulating layer 20 is made of the reinforcement-free insulating resin that does not include a reinforcing member such as glass cloth or the like, the surface of the insulating layer 20 can easily be polished to the flat surface without the possibility of the reinforcing member such as the glass cloth or the like protruding from the surface of the insulating layer 20.

Figure 17A:
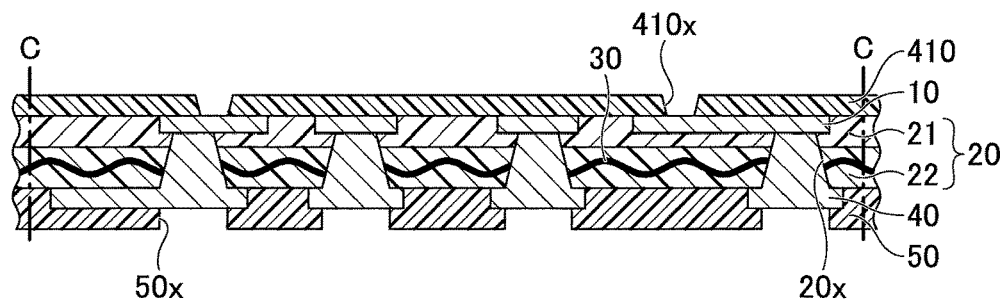
FIGS. 17A, 17B, and 17C are diagrams illustrating an example of the manufacturing processes of the circuit board in the third embodiment.

Next, in a process illustrated in FIG. 17A, the insulating layer 410 is formed on the flat surface formed by the other surface of the wiring layer 10 and the other surface of the insulating layer 20. Then, via holes 410x penetrating the insulating layer 410 and exposing the other surface of the wiring layer 10 are formed in the insulating layer 410. The insulating layer 410 may be made of a thermosetting photosensitive insulating resin including, as a main component, an epoxy resin, a phenol resin, or the like, for example.

More particularly, the insulating layer 410 may be formed by spin-coating the thermosetting photosensitive insulating resin in liquid form or paste form, for example, on the flat surface formed by the other surface of the wiring layer 10 and the other surface of the insulating layer 20, and heating and curing the insulating resin. The insulating layer 410 is exposed and developed to form the via holes 410x by lithography technique. By using the thermosetting photosensitive insulating resin for the insulating layer 410, the via holes 410x can be formed by the photolithography technique, to suit forming micro wirings. For the sake of convenience, FIGS. 17A through 17C illustrate the structure in an upside-down state compared to the state of the structure illustrated in FIGS. 16A through 16C.

Figure 17B:
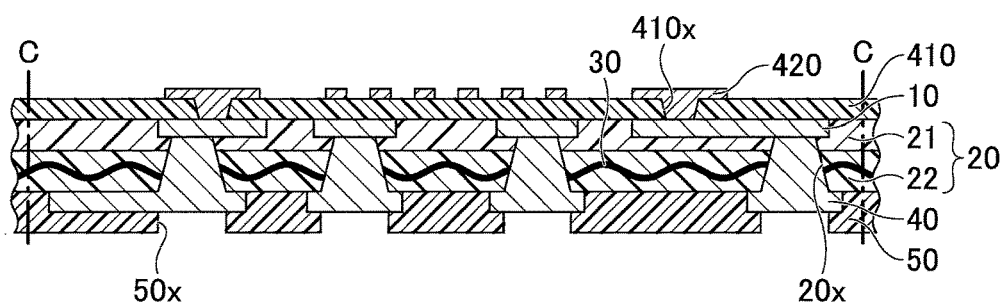

Next, in a process illustrated in FIG. 17B, the wiring layer 420 is formed on the other surface of the insulating layer 410 by the semi-additive method or the like, for example. Next, in a process illustrated in FIG. 17C, the processes illustrated in FIGS. 17A and 17B are repeated, to successively stack the insulating layer 430, the wiring layer 440, the insulating layer 450, and the wiring layer 460 on the other surface of the insulating layer 410.

Figure 17C:
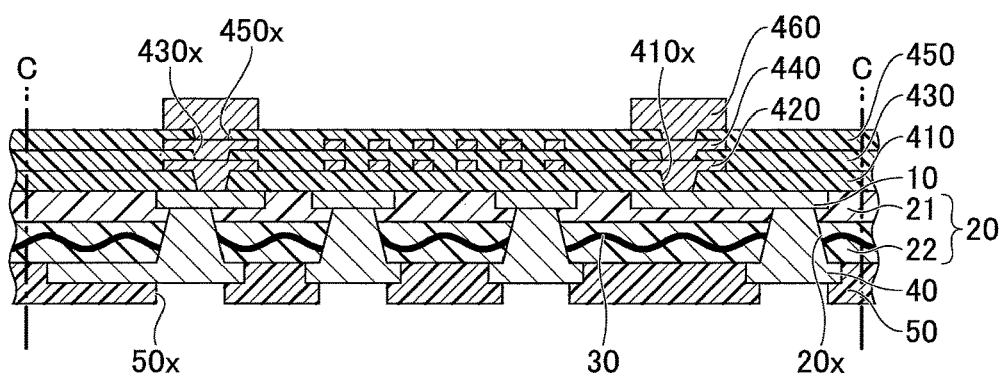

After the process illustrated in FIG. 17C, the structure illustrated in FIG. 17C is cut into a plurality of circuit boards 8 illustrated in FIG. 15 by the slicer or the like. As a result, the plurality of circuit boards 8 are completed. A metal layer may be formed on, or an oxidation preventing process may be performed on the surface of the pads forming the wiring layer 460. The surface of the pads subjected to the metal layer forming or the oxidation preventing process may include only the upper surface of the pads or the upper and side surfaces of the pads forming the wiring layer 460. In addition, a solder resist layer (not illustrated) may be provided on the other surface of the insulating layer 450, and pads exposed through openings in the solder resist layer may form the wiring layer 460.

According to the circuit board 8 in the third embodiment, the other surface of the wiring layer 10 and the other surface of the insulating layer 20 (other surface of the insulator film 21) are polished into the single flat surface. For this reason, the other surfaces of each of the insulating layers 410, 430, and 450 that are formed on the single flat surface also become flat surfaces. Consequently, micro wirings of the wiring layers 420, 440, and 460 can easily be formed on the flat surfaces of the insulating layers 410, 430, and 450, respectively.

(Third Application of Circuit Board)

In a third application of the circuit board, a semiconductor chip is mounted (flip-chip bonded) on the circuit board of the third embodiment, to form an example of a semiconductor package. In this third application, a description of those parts that are the same as those of the first and second embodiments will be omitted.

Figure 18:
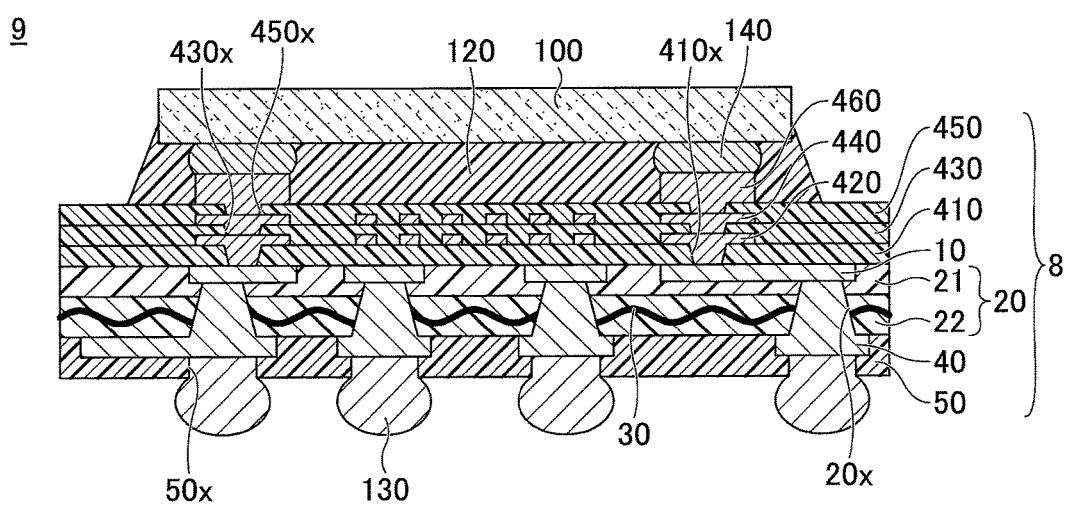
FIG. 18 is a cross sectional view illustrating an example of the semiconductor package in a third application.

FIG. 18 is a cross sectional view illustrating an example of the semiconductor package in the third application. As illustrated in FIG. 18, a semiconductor package 9 includes the circuit board 8 illustrated in FIG. 15, a semiconductor chip 100, solder bumps 140, an underfill resin 120, and bumps 130. In the semiconductor package 9, the side of the insulating layer 450 of the circuit board 8 forms a chip mounting surface on which the semiconductor chip 100 is mounted. On the other hand, the side of the solder resist layer 50 of the circuit board 8 forms a terminal surface on which external connecting terminals are formed.

The solder bumps 140 electrically connect electrode pads (not illustrated) of the semiconductor chip 100 and the pads forming the wiring layer 460 of the circuit board 8. The semiconductor chip 100 may include copper pillars. The solder bumps 140 may be made of a material such as an alloy including Pb, an alloy of Sn and Cu, an alloy of Sn and Ag, an alloy of Sn, Ag, and Cu, or the like.

The underfill resin 120 fills a gap between the semiconductor chip 100 and the circuit board 8 (insulating layer 450). The bumps 130 form external connecting terminals formed on the upper surface of the wiring layer 40 exposed at the bottom part of the openings 50x in the solder resist layer 50.

Accordingly, the semiconductor package 9 can be obtained by mounting the semiconductor chip 100 on the circuit board 8 of the third embodiment.

According to each of the embodiments, modifications, and applications, it is possible to improve the strength and the insulating reliability of the circuit board.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, in the embodiments and modifications described above, the lower surface of the first insulator film 21 and the lower surface (exposed surface) of the wiring layer 10 may form a single surface, or the lower surface of the wiring layer 10 may cave in more than the lower surface of the first insulator film 21. However, the lower surface of the wiring layer 10 may protrude from the lower surface of the first insulator film 21.

In addition, the support base 300 may be made of a material other than copper, such as nickel, chromium, iron, or the like. The support base 300 may be made of a metal film or a metal plate that can be etched by an etchant other than an etchant used to etch the wiring layer 10. In this case, the lower surface of the wiring layer 10 matches the lower surface of the first insulator film 21, to form a single surface.

Furthermore, in a case in which the wiring layer 10 and the support base 300 are made of the same metal, an etching barrier layer made of a metal different from the metal forming the wiring layer 10 may be provided on the upper surface of the support base 300. For example, in a case in which both the wiring layer 10 and the support base 300 are made of copper, an etching barrier layer made of nickel, chromium, iron, or the like may be formed on the entire upper surface of the support base 300 by electroplating or the like. Thereafter, the wiring layer 10, the insulating layer 20, or the like may be successively stacked on the etching barrier layer. Then, the support base 300 is removed by etching, and next, the etching barrier layer is removed by etching using an etchant that does not etch the wiring layer 10, to complete the circuit board. In this case, the lower surface of the wiring layer 10 also matches the lower surface of the first insulator film 21, to form a single surface.

The description above uses terms such as "determine", or the like to describe the embodiments, however, such terms are abstractions of the actual operations that are performed. Hence, the actual operations that correspond to such terms may vary depending on the implementation, as is obvious to those skilled in the art.

Although the embodiments, modifications, and applications are numbered with, for example, "first," "second," or "third," the ordinal numbers do not imply priorities of the embodiments, the modifications, and the applications. Many other variations and modifications will be apparent to those skilled in the art.

Various aspects of the subject-matter described herein are set out non-exhaustively in the following numbered clauses:

1. A method of manufacturing a circuit board, comprising:
   forming a first wiring layer on a surface of a support base;
   forming a semi-cured first insulator film on the surface of the support base to cover the first wiring layer, wherein the first insulator film is made of a reinforcement-free resin that includes no reinforcing member;
   forming a semi-cured second insulator film on the first insulator film, wherein the second insulator film is made of a reinforcing member impregnated with a resin;
   providing an insulating layer having the second insulator film stacked on the first insulator film, by curing the first insulator film and the second insulator film;
   forming a plurality of via holes penetrating the insulating layer and exposing a surface of the first wiring layer opposite to another surface of the first wiring layer in contact with the surface of the support base; and
   forming a second wiring layer including a plurality of wiring patterns formed on the second insulator film, and a plurality of via wirings formed in the plurality of via holes and electrically connecting the plurality of wiring patterns to the first wiring layer.

2. The method of manufacturing the circuit board of clause 1, further comprising:
   removing the support base.

3. A method of manufacturing a circuit board, comprising:
   forming a first wiring layer on a surface of a support base;
   preparing an insulating layer that includes a semi-cured first insulator film made of a reinforcement-free resin that includes no reinforcing member, and a semi-cured second insulator film stacked on the first insulator film and made of a reinforcing member impregnated with a resin;

curing the insulating layer in a state in which the first insulator film is oriented to face the support base and the first insulator film is adhered on the surface of the support base to cover the first wiring layer;

forming a plurality of via holes penetrating the insulating layer and exposing a surface of the first wiring layer opposite to another surface of the first wiring layer in contact with the surface of the support base; and forming a second wiring layer including a plurality of wiring patterns formed on the second insulator film, and a plurality of via wirings formed in the plurality of via holes and electrically connecting the plurality of wiring patterns to the first wiring layer.

4. The method of manufacturing the circuit board of clause 3, further comprising:

removing the support base.

What is claimed is:

1. A circuit board comprising:
a first insulating layer including a first insulator film, and a second insulator film provided on a first surface of the first insulator film, wherein a second surface of the first insulator film opposite to the first surface is exposed to an outside of the circuit board;
a first wiring layer, formed by a single flat layer and embedded in the first insulator film, and including a predetermined surface provided with a plurality of pads and a plurality of first wiring patterns, wherein a surface of each of the plurality of pads, forming the predetermined surface, is exposed from the second surface of the first insulator film; and
a second wiring layer including a plurality of second wiring patterns formed on a first surface of the second insulator film opposite to a second surface of the second insulator film in contact with the first surface of the first insulator film, and a plurality of via wirings,
wherein each of the plurality of via wirings has a continuously tapered shape forming a single inverted cone shape continuously penetrating only the second insulator film along a direction in which the second insulator film is provided on the first surface of the first insulator film and electrically connecting the second wiring patterns directly to a surface of the first wiring layer opposite to the predetermined surface,
wherein the first insulator film is made of a reinforcement-free resin that includes no reinforcing member, and covers only side surfaces of the first wiring layer, and
wherein the second insulator film is made of a reinforcing member impregnated with a resin, and the second surface of the second insulator film makes contact with the surface of the first wiring layer opposite to the predetermined surface.

2. The circuit board as claimed in claim 1, further comprising:
a solder resist layer provided on the second surface of the first insulator film and including an opening exposing the surface of each of the plurality of pads forming the predetermined surface.

3. The circuit board as claimed in claim 1, wherein the second surface of the first insulator film forms a chip mounting surface on which a semiconductor chip is mounted.

4. The circuit board as claimed in claim 1, further comprising:
a second insulating layer provided on the second insulator film and covering the plurality of second wiring patterns of the second wiring layer; and
a third wiring layer, provided on the second insulating layer, and electrically connecting to the plurality of second wiring patterns of the second wiring layer.

5. A semiconductor package comprising:
a circuit board according to claim 1; and
a semiconductor chip, mounted on the second surface of the first insulator film, and having a plurality of electrode pads electrically connected to the plurality of pads of the first wiring layer.

6. A semiconductor package comprising:
a first circuit board according to claim 1;
a first semiconductor chip, mounted on the second surface of the first insulator film of the first circuit board, and having a plurality of electrode pads electrically connected to the plurality of pads of the first wiring layer of the first circuit board;
a second circuit board according to claim 1;
a second semiconductor chip, mounted on the second surface of the first insulator film of the second circuit board, and having a plurality of electrode pads electrically connected to the plurality of pads of the first wiring layer of the second circuit board; and
a plurality of solder balls electrically connecting the first wiring layer of the first circuit board and the second wiring layer of the second circuit board, to electrically connect the first semiconductor chip and the second semiconductor chip.

7. The circuit board as claimed in claim 1, wherein the second insulator film is embedded solely with the plurality of via wirings having the continuously tapered shape.

8. A circuit board comprising:
a first insulating layer including a first insulator film, and a second insulator film provided on a first surface of the first insulator film, wherein a second surface of the first insulator film opposite to the first surface is exposed to an outside of the circuit board;
a first wiring layer, formed by a single flat layer and embedded in the first insulator film, and including a predetermined surface provided with a plurality of pads and a plurality of first wiring patterns, wherein a surface of each of the plurality of pads, forming the predetermined surface, is exposed from the second surface of the first insulator film; and
a second wiring layer including a plurality of second wiring patterns formed on a first surface of the second insulator film opposite to a second surface of the second insulator film in contact with the first surface of the first insulator film, and a plurality of via wirings,
wherein each of the plurality of via wirings has a continuously tapered shape forming a single inverted cone shape continuously penetrating the first insulator film and the second insulator film along a direction in which the second insulator film is provided on the first surface of the first insulator film and electrically connecting the second wiring patterns directly to a surface of the first wiring layer opposite to the predetermined surface,
wherein the first insulator film is made of a reinforcement-free resin that includes no reinforcing member,
wherein the second insulator film is made of a reinforcing member impregnated with a resin, and
wherein the first insulator film covers side surfaces of the first wiring layer, and partially covers the surface of the first wiring layer opposite to the predetermined surface.

9. A semiconductor package comprising:
a circuit board according to claim 8; and
a semiconductor chip, mounted on the second surface of the first insulator film, and having a plurality of electrode pads electrically connected to the plurality of pads of the first wiring layer.

10. A semiconductor package comprising:
a first circuit board according to claim 8;
a first semiconductor chip, mounted on the second surface of the first insulator film of the first circuit board, and having a plurality of electrode pads electrically connected to the plurality of pads of the first wiring layer of the first circuit board;
a second circuit board as claimed in claim 8;
a second semiconductor chip, mounted on the second surface of the first insulator film of the second circuit board, and having a plurality of electrode pads electrically connected to the plurality of pads of the first wiring layer of the second circuit board; and
a plurality of solder balls electrically connecting the first wiring layer of the first circuit board and the second wiring layer of the second circuit board, to electrically connect the first semiconductor chip and the second semiconductor chip.

11. The circuit board as claimed in claim 8, further comprising:
a solder resist layer provided on the second surface of the first insulator film and including an opening exposing the surface of each of the plurality of pads forming the predetermined surface.

12. The circuit board as claimed in claim 8, wherein the second surface of the first insulator film forms a chip mounting surface on which a semiconductor chip is mounted.

13. The circuit board as claimed in claim 8, further comprising:
a second insulating layer provided on the second insulator film and covering the plurality of second wiring patterns of the second wiring layer; and
a third wiring layer, provided on the second insulating layer, and electrically connecting to the plurality of second wiring patterns of the second wiring layer.

14. The circuit board as claimed in claim 8, wherein the second insulator film is embedded solely with the plurality of via wirings having the continuously tapered shape.

15. A circuit board comprising:
a first insulating layer including a first insulator film, and a second insulator film provided on a first surface of the first insulator film, wherein a second surface of the first insulator film opposite to the first surface is exposed to an outside of the circuit board;
a first wiring layer, formed by a single flat layer and embedded in the first insulator film, and including a predetermined surface provided with a plurality of pads and a plurality of first wiring patterns, wherein a surface of each of the plurality of pads, forming the predetermined surface, is exposed from the second surface of the first insulator film; and
a second wiring layer including a plurality of second wiring patterns formed on a first surface of the second insulator film opposite to a second surface of the second insulator film in contact with the first surface of the first insulator film, and a plurality of via wirings penetrating only the second insulator film and electrically connecting the second wiring patterns directly to a surface of the first wiring layer opposite to the predetermined surface,
wherein the surface of the first wiring layer opposite to the predetermined surface protrudes from the first surface of the first insulator film into the second insulator film,
wherein each of the plurality of via wirings penetrates only the second insulator film, and electrically connects to the surface of the first wiring layer opposite to the predetermined surface,
wherein the first insulator film is made of a reinforcement-free resin that includes no reinforcing member, and covers only side surfaces of the first wiring layer, and
wherein the second insulator film is made of a reinforcing member impregnated with a resin.

16. The circuit board as claimed in claim 15, further comprising:
a solder resist layer provided on the second surface of the first insulator film and including an opening exposing the surface of each of the plurality of pads forming the predetermined surface.

17. The circuit board as claimed in claim 15, wherein the second surface of the first insulator film forms a chip mounting surface on which a semiconductor chip is mounted.

18. The circuit board as claimed in claim 15, further comprising:
a second insulating layer provided on the second insulator film and covering the plurality of second wiring patterns of the second wiring layer; and
a third wiring layer, provided on the second insulating layer, and electrically connecting to the plurality of second wiring patterns of the second wiring layer.

\* \* \* \* \*